United States Patent [19]
Natori et al.

[11] Patent Number: 5,668,469
[45] Date of Patent: Sep. 16, 1997

[54] DIGITAL OSCILLOSCOPE USING COLOR PLANE DISPLAY DEVICE AND DATA DISPLAY METHOD THEREFORE

[75] Inventors: Kazuya Natori, Kodaira; Mitsunobu Iwabuchi, Musashino; Shigenori Kawamura, Kokubunji, all of Japan

[73] Assignee: Hitachi Denshi Kabushiki Kaisha, Tokyo, Japan

[21] Appl. No.: 266,694

[22] Filed: Jun. 28, 1994

[30] Foreign Application Priority Data

Jun. 28, 1993 [JP] Japan ................................ 5-181948
Sep. 27, 1993 [JP] Japan ................................ 5-239622

[51] Int. Cl.⁶ ............................ G01R 13/00; G01R 19/00
[52] U.S. Cl. ................................. 324/121 R; 364/487
[58] Field of Search ........................ 324/121; 364/487; 345/88, 92

[56] References Cited

U.S. PATENT DOCUMENTS

| | | | |
|---|---|---|---|
| 4,114,095 | 9/1978 | Pankove et al. | 324/121 R |
| 4,364,080 | 12/1982 | Vidovic | 348/185 |
| 4,868,496 | 9/1989 | Havel | 324/121 R |
| 4,953,017 | 8/1990 | Ivey et al. | 348/185 |

FOREIGN PATENT DOCUMENTS

| | | |
|---|---|---|
| 2544489 | 4/1977 | Denmark . |
| 0206518 | 12/1986 | European Pat. Off. . |
| A-0336594 | 3/1989 | European Pat. Off. . |
| 0435391 | 7/1991 | European Pat. Off. . |
| A-0631143 | 6/1994 | European Pat. Off. . |
| 2408882 | 6/1979 | France . |
| U-9214790 | 10/1992 | Germany . |
| 53-84789 | 7/1978 | Japan . |
| 54-8566 | 1/1979 | Japan . |
| 55-008161 | 1/1980 | Japan . |
| 58-14171 | 1/1983 | Japan . |
| 4-143664 | 5/1992 | Japan . |
| 4-314094 | 11/1992 | Japan . |
| A-2183420 | 11/1985 | United Kingdom . |
| A-2266636 | 4/1992 | United Kingdom . |

OTHER PUBLICATIONS

T. Okada, "Color TFT LCD Forms Core of B5, Notebook Color Digital Oscilloscope", Journal Electron. Eng., vol. 66, No. 326, Feb. 1994, pp. 34–37.

Elektronik, vol. 35, No. 8, Apr. 1986, DE pp. 126–130 Messplatz fur die Westentasche abstract; figures 1–3 p. 128, right column, paragraph 3.

Electronic Engineering, vol. 66, No. 806, Feb. 1994, London GB pp. 57–61, Colour displays for digital storage oscilloscopes p. 57, left column, line 1 – column 3, line 1; figure 2.

Journal Electr. Eng., vol. 31, No. 326, Feb. 1994, JP pp. 34 – 37 T. Okada Color TFT LCD Forms Core of B5, Notebook Color Digital OScilloscope abstract; figure 1.

*Primary Examiner*—Ernest F. Karlsen
*Attorney, Agent, or Firm*—Antonelli, Terry, Stout & Kraus, LLP.

[57] ABSTRACT

In a digital oscilloscope, a sharp and fine line can be displayed at high horizontal resolution. The digital oscilloscope includes a memory for storing waveform data to be displayed; a display data output unit including sync signal generating unit for generating a sync signal and an output unit for reading the waveform data from the memory in synchronism with the sync signal to output said read waveform data; and an audio/visual color dot matrix plane display device including a display unit having dots arranged in a matrix form for color representation. The scan clock signal generator generating the scan clock signal in synchronism with the sync signal produced from sync signal generating unit, and the dot scan control unit sequentially supplying the display data outputted from the output unit in synchronism with the scanning clock signal to the dots of the display unit, whereby the content of the waveform data is displayed on the display unit.

9 Claims, 21 Drawing Sheets

FIG. 9
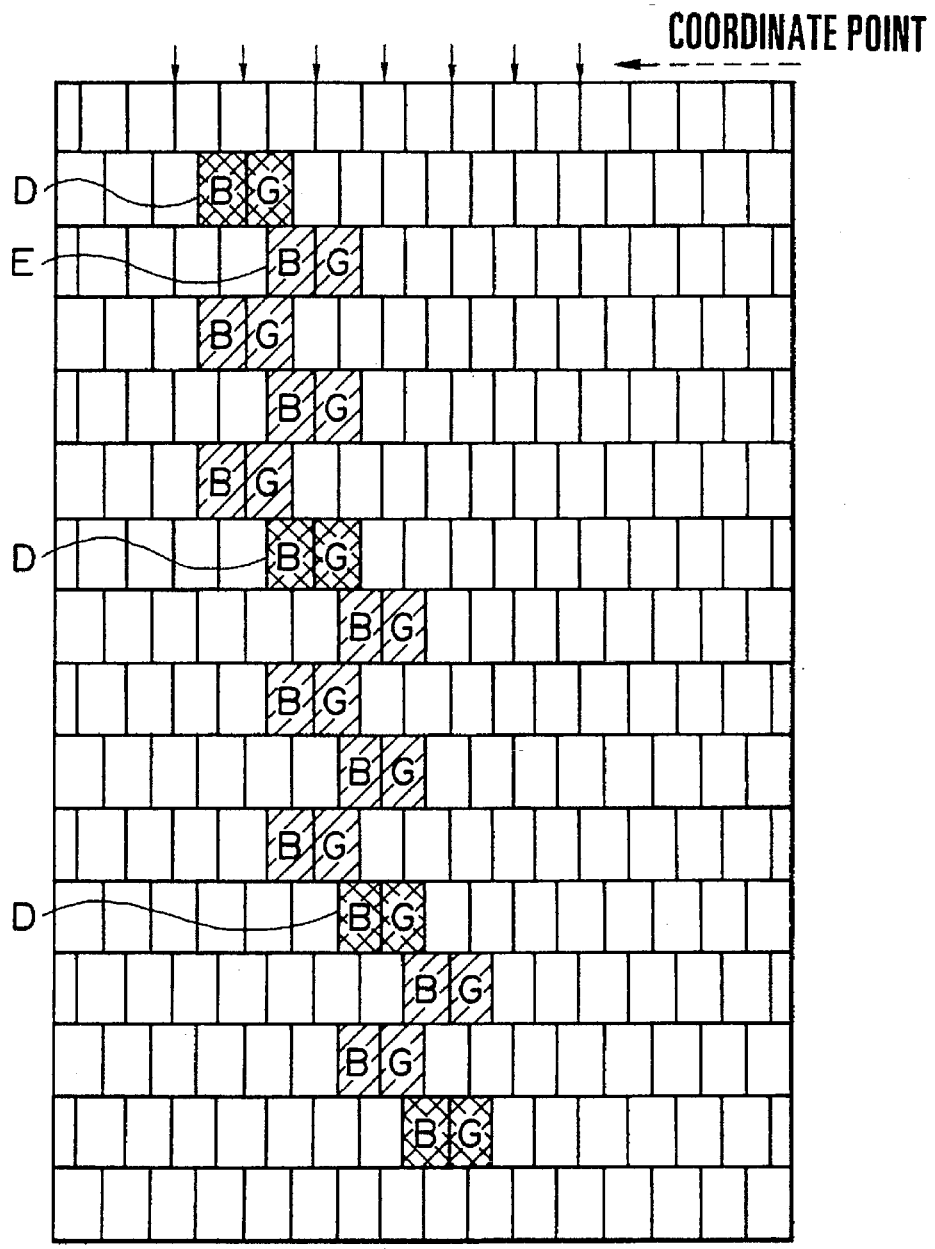
DATA IN DISPLAY MEMORY
INTERPOLATED DATA

DIGITAL OSCILLOSCOPE USING COLOR PLANE DISPLAY DEVICE AND DATA DISPLAY METHOD THEREFORE

BACKGROUND OF THE INVENTION

1. Field of the Invention

The present invention generally relates to a digital oscilloscope using a color plane display device and to a data display method in such a digital oscilloscope. More specifically, the present invention is directed to a digital oscilloscope using a color dot matrix plane display device and also to a data display method performed in such a digital oscilloscope.

2. Description of the Related Art

Oscilloscopes have been widely utilized to observe waveforms, and therefore are very useful in research/development, production, maintenance, and repair works. As is well known in this technical field, a cathode-ray tube (CRT) has been conventionally employed as the display device of an oscilloscope.

For instance, such conventional oscilloscopes have been proposed in which the color CRT is employed, or the color LCD shutter is provided in front on the CRT (see JP-A-53-84789, JP-A-54-8566, JP-U-58-14171). When such oscilloscopes are employed, the waveforms can be displayed with different color representations in the respective display channels, which can provide very easy waveform observations.

However, generally speaking, cathode-ray tubes necessarily require relatively long lengths from screen surfaces up to electron guns, as compared with the screen sizes. Accordingly this fact prevents compact arrangements of the conventional oscilloscopes.

On the other hand, compact/light weight digital oscilloscopes have been proposed to utilize the liquid crystal displays (LCD). These conventional digital oscilloscopes use monochromatic LCDs. For instance, JP-A-4-143664 discloses such a digital oscilloscope which uses the active matrix type LCD as the display device. This prior art proposes that the switch elements for driving the pixel electrode group are fabricated by way of the silicon single crystal thin-film layer in the device, and such an LCD which is usable in the oscilloscope is thus manufactured.

As previously explained, the color representation of signal waveforms cannot be apparently realized by employing the monochromatic LCD exclusively utilized in the oscilloscope. To perform a color representation of waveform data, either an LCD for a computer display screen (so-called "office automation type LCD") is employed, or a so-termed audio/visual type color dot matrix type plane display device is employed. However, although in the office automation type LCD, a designation of color can be made in correspondence with the waveform display position, there are many drawbacks. That is, since one pixel is accessed by 3 dots (R, G, B), the required resolution in the horizontal direction would be deteriorated when the display screen becomes small. When the size of one dot is made small, higher machining precision is required. Moreover, such a high precision LCD has a high cost, and the resultant oscilloscope cannot be made compact. On the other hand, when the audio/visual active matrix type LCD is employed in the digital oscilloscope, the display control is carried out for every one line, namely, based upon the horizontal sync signal. As a result, such a phenomenon happens to occur in that one pixel of this active matrix type LCD is emitted at a certain position, whereas two pixels thereof are emitted in response to certain display data, resulting in deterioration of the display quality along the horizontal direction.

In particular, when a compact color dot matrix type display device is used in an oscilloscope, since a total pixel number along the horizontal direction is small, a representation quality such as smoothness of a display wave is lowered.

It should be understood that an office automation type color dot matrix plane display device is such a display device that in response to a clock (namely, external clock) derived from a display control unit for controlling this display device and image pixel data synchronized with this external clock, the driving/scanning operations of the pixels are controlled. Also, an audio/visual type color dot matrix plane display device is such a display device that a frequency synthesizer (e.g., PLL) is provided, and the sampling/scanning operations of the externally supplied video signal are carried out in response to the clock produced by the synthesizer.

In the LCD, it is known, as described in JP-A-55-8161 and JP-A-4-314094, that the analog video signal is coincident with the display timing for the audio/visual type LCD. If such a known technique is utilized, then the sampling operation, the signal acquisition at the display device, and the scanning operation can be performed in a stable condition with respect to the sync signal.

As is well known in the art, for instance in a color dot matrix display device, a plurality of pixels of three primary colors, red (R), green (G), blue (B) are arranged in a manner as shown in FIG. 22, or FIG. 23, and these R, G, B pixels are emitted in response to data. FIG. 22 and FIG. 23 are enlarged views of a portion of the pixels in the color dot matrix devices.

Referring now to FIG. 22 and FIG. 23, a description is given for an example of a display method when the color dot matrix display device is used in the oscilloscope to display the data.

It should be noted that symbols X1, X2, X3, . . . , shown in FIG. 22 and FIG. 23 represent coordinate points along the X-coordinate axis (namely, the coordinate axis along the horizontal scanning direction), and then the display data are produced coinciding with this coordinate point. That is, one set of R, G, B constitutes one coordinate point.

As illustrated in FIG. 22, when a plurality of R, G, B pixel arrays are arranged on the line LH along the respective horizontal scanning direction in the order of R, G, B, R, G, B in the color dot matrix display device, assuming now that the first pixel groups in the respective lines are $R_1$, $G_1$, $B_1$, and the second pixel groups in the respective lines are $R_2$, $G_2$, $B_2$, and so on, these pixel arrays are emitted for every 1 line. In other words, the dots R, G, B belonging to each pixel group are emitted in such a manner that the first pixel group $R_1$, $G_1$, $B_1$ in the line LHn is emitted by the first applied data, the second pixel group $R_2$, $G_2$, $B_2$ in the line $LH_{n+2}$ is emitted by the second applied data, and the third pixel groups $R_3$, $G_3$, $B_3$ in the line $LH_{n+4}$ is emitted by the third applied data.

In this case, the horizontal resolution is equal to the horizontal resolution as indicated by the X coordinates X1, X2, X3, . . . of FIG. 22, since emission of 1 group of the dots R, G, B is carried out in units of resolution.

Also, as shown in FIG. 23, when the R, G, B dot arrangement of the color dot matrix display device is in a delta arrangement, and the dots G, R, B, G, R, B are arranged in the line LHn and the line LH (n+even number) along the horizontal direction, and the dots B, G, R, B, G, R are arranged in the line LH (n+odd number), assuming now that the first and second pixel groups in the line LHn and the line LH (n+even number) are $G_1$, $R_1$, $B_1$, and $G_2$, $R_2$, $B_2$, and so on; and the first pixel group in the line LH (n+odd number) is $B_1$, $G_1$, $R_1$, . . . and the second pixel group thereof is $B_2$, $G_2$, $R_2$, . . . for instance, the dots G and R are emitted (it becomes yellow light). Observing a case in which a horizontal line is emitted on the line LHn, the first pixel group of $G_1$, $R_1$ is emitted at the first data (coordinate X1), and the second data is not emitted since there is no same group of dots at the coordinate Xz, and further the second pixel group of $G_2$, $R_2$ at the second data (coordinate X3) is emitted. Similarly, the fourth data is not emitted because there is no same group in the coordinate X4. At the fifth data (coordinate X5), the third pixel group of $G_3$, $R_3$ is emitted. In this manner, the dots R and G belonging to the respective pixel groups of the respective lines are emitted. However, in this case, since the dots R and G of the respective pixel groups in the line LH (n+odd number) are not present on the same coordinate as the line LHn and the line LH (n+even number), the line LH (n+odd number) cannot be emitted.

Consequently, the horizontal resolution in this case is equal to that indicated by the coordinate points X1, X2, X3, . . . on the X coordinate shown in FIG. 23. As described above, the total number of pixel groups is only half of the total quantity of coordinates, so that the data cannot be effectively displayed.

SUMMARY OF THE INVENTION

An object of the present invention is to provide a digital oscilloscope which employs a color dot matrix plane display device capable of solving the drawbacks of the above-described conventional digital oscilloscope/data display method, and to provide a data display method for use in this digital oscilloscope.

Another object of the present invention is such that pixels (display unit) can be displayed in a small size in a data display of a digital oscilloscope.

A further object of the present invention is to provide a digital oscilloscope which employs a compact color dot matrix plane display device which is capable of displaying a waveform with high resolution, and also to provide a data display method performed in such a digital oscilloscope.

A still further object of the present invention is to provide a digital oscilloscope which employs a TFT-LCD used for a color television.

According to an aspect of the present invention, there is provided a digital oscilloscope including: a memory for storing display data; a display data output unit including a sync signal generating device and an output unit for reading said display data from said memory in synchronism with said sync signal to output said read display data; and a color dot matrix plane display device including a display unit having dots arranged in a matrix form for color representation, a dot scan control unit for sequentially supplying said display data output from the output unit to said dots so as to display a content of said display data, and a scanning clock signal generator for generating a scanning clock signal in order to scan said display unit; wherein said scan clock signal generator generates said scan clock signal in synchronism with said sync signal produced from sync signal generating device, and said dot scan control unit sequentially supplies said display data output from said output unit in synchronism with said scanning clock signal to said dots of the display unit, whereby the content of said display data is displayed on said display unit.

According to an example of the present invention, said dot scan control unit of said color dot matrix plane display device produces timing clock signals whose phases are different from each other by a time period of said scanning clock signal for each of different color dots in synchronism with said scanning clock signal, and sequentially supplies said display data derived from said display data generating means to the respective color dots corresponding to said timing clock signals in synchronism with said timing clock signals; said display data output unit outputs said display data read out from said memory to said plane display device for the respective color dots to be displayed in response to said sync signal at a timing in synchronism with said timing clock; and said dot scan control unit of said plane display device supplies said display data for the respective color dots to be displayed, which are supplied from said display data output unit in synchronism with said timing clock signals, to said corresponding color dots in synchronism with said relevant timing clocks.

According to another example of the present invention, said sync signal generating unit includes a clock signal generator for generating a clock signal, and a first frequency divider for frequency-dividing said clock signal at a first frequency dividing ratio to obtain a horizontal sync signal and to output said horizontal sync signal as said sync signal; said scanning clock signal generator includes a variable frequency oscillator for producing, as said scanning clock signal, a signal whose frequency is variable and higher than the frequency of said horizontal sync signal by a number of times (the number being and integer), a second frequency divider for frequency-dividing the signal from said variable frequency oscillator at a second frequency dividing ratio to output the frequency-divided signal, and a phase control unit for controlling the frequency of the output signal from said variable frequency oscillator in order that the phase of the output signal from said second frequency divider is equal to the phase of said horizontal sync signal derived from said first frequency divider; wherein a ratio of said first frequency dividing ratio of said first frequency divider to said second frequency dividing ratio of said second frequency divider is substantially equal to an integer.

As previously explained, in accordance with the present invention, the internal sync signal (horizontal sync signal) used to read/output the waveform data in the display data output unit is supplied to the color dot matrix plane display device (for instance, a color TV TFT-LCD). In this plane display device, the scanning clock signal is obtained which is in synchronism with the sync signal, and the waveform data is displayed on the display unit in response to this scanning clock signal. Consequently, the waveform data output timing by the display data output unit may be in synchronism with the waveform data display timing at the plane display device, so that the display of the waveform data can be controlled in units of the continuous two pixels or less even in the digital oscilloscope with employment of, for example, an audio/visual color dot matrix plane display device, and thus the display resolution along the horizontal scanning direction can be improved.

In this case, the above-described sync signal is obtained by frequency-dividing the clock signal of the clock signal generator by the first frequency dividing ratio in the display data output unit. In the plane display device, the output signal (scanning clock signal) from the variable frequency oscillator is frequency-divided by the second frequency dividing ratio to obtain the signal. The phase control of this variable frequency oscillator is performed in order that the phase of this frequency-divided signal is synchronized with the phase of the sync signal. Since the ratio of the first frequency ratio to the second frequency ratio is selected to be an integer, the waveform data output timing by the display data output unit is in synchronism with the waveform data display timing at the plane display device. Thus, the display of the waveform data can be controlled in units of the continuous two dots, or less.

A so-called "3-phase timing generator circuit" is employed in the display data output unit in order that the output timings of the waveform data for the respective color output from the display data output unit is synchronized with the display timings of the waveform data for the respective color in the plane display device.

According to another aspect of the present invention, there is provided a method for displaying waveform data in a digital oscilloscope by employing a color dot matrix plane display device equipped with a display unit having different color dots arranged in a matrix shape, comprising the steps of: displaying coordinate points (display unit) used to display waveform data by way of a combination of adjoining different color dots; and displaying at least one of the dots for constituting coordinate points located adjacent to said respective coordinate points byway of at least one of said dots of said respective coordinate points.

As a result, the coordinate point (display data point) to be displayed can be controlled in units of 2 dots or less.

According to an example of the present invention, when there is at least one row of dots along the horizontal scanning direction between two adjoining coordinate points along the vertical scanning direction within the continuous coordinate points for displaying the waveform data, only one dot present at the same coordinate position as one of the two adjoining coordinate points along the horizontal scanning direction in at least one of the row of dots along the horizontal scanning direction, is displayed as a display unit used to display a waveform.

In other words, conventionally three dots of R, G, B are used to constitute one pixel to give the coordinate, and are controlled in units of this one pixel. To the contrary, according to the present invention, a single coordinate is given to each of these color dots R, B, G; two dots of combining these color dots; or dot combinations of the adjoining pixels, and these dots are controlled in units of one dot.

For instance, when the data of one channel is displayed, the data interpolation of this display data along the vertical direction (vertical scanning direction) is performed as follows. That is, the number of pixels to be interpolated is selected to be equal to the number defined in such a way that the display data intersects the line in the respective lines to be data-interpolated. As a result, the data interpolation of the waveform data may be realized by a sharp and fine line.

BRIEF DESCRIPTION OF THE DRAWINGS

FIG. 9 is a schematic illustration for explaining the conventional data interpolating method, in the screen of the color LCD display unit where the dots are arranged in a delta form;

DESCRIPTION OF THE PREFERRED EMBODIMENTS

Referring now to the accompanying drawings, a detailed description will now be made of a digital oscilloscope which employs a color plane display device and a data display method for the digital oscilloscope, according to an embodiment of the present invention.

Figure 1:
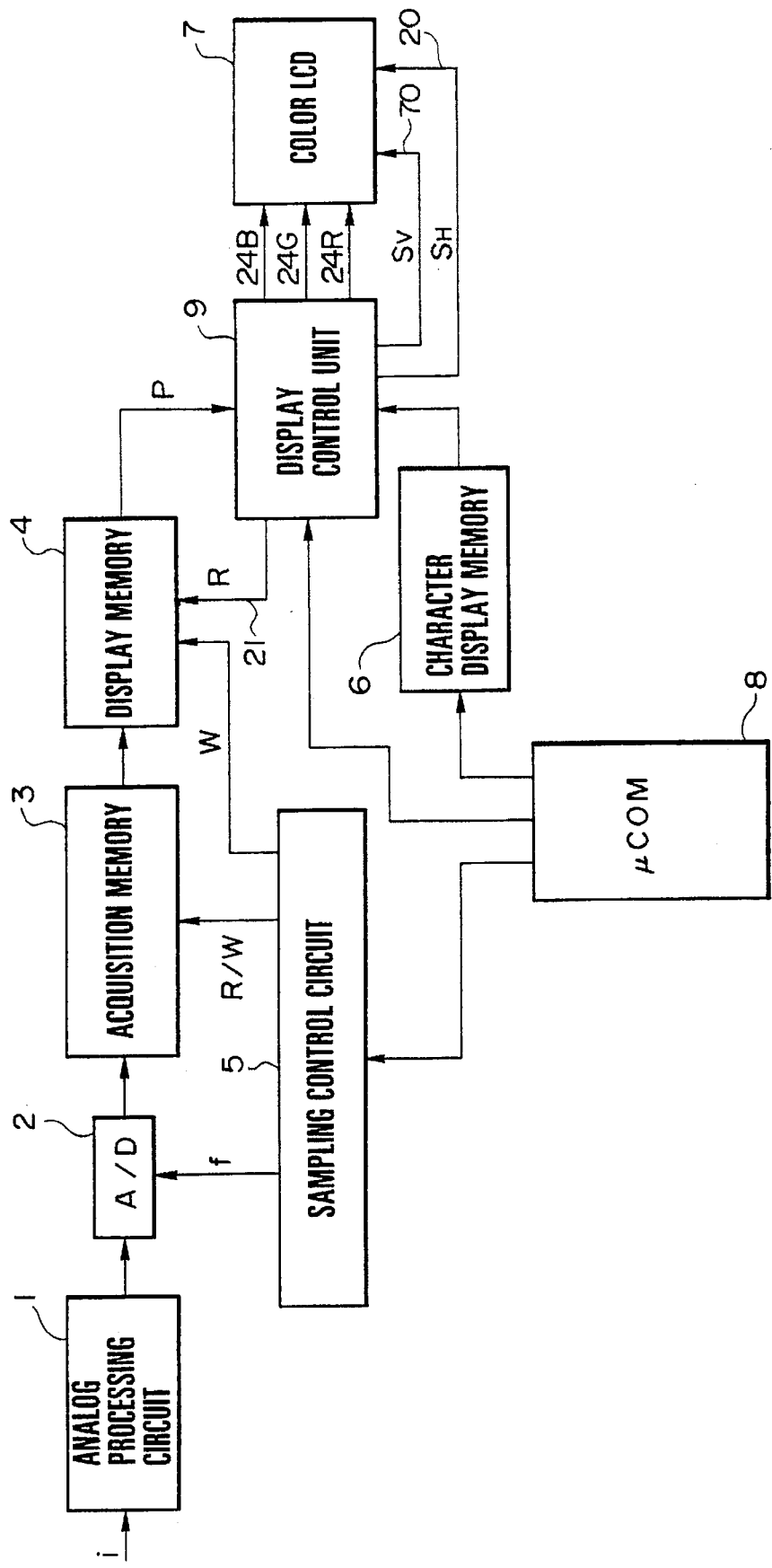
FIG. 1 is a schematic block diagram for representing an overall arrangement of a digital oscilloscope according to the present invention.

In the beginning, a schematic arrangement/operation of a digital oscilloscope according to the present invention will now be described. FIG. 1 schematically shows an overall arrangement of the digital oscilloscope according to the present invention. An operation of this digital oscilloscope will now be briefly explained.

An input signal "i" to be observed is entered into an analog processing circuit 1, and this signal is processed by this analog processing circuit 1 to have a predetermined amplitude level range. Subsequently, the signal to be observed which has been input from the analog processing circuit 1 into an analog-to-digital (A/D) converter 2, is converted into a corresponding digital signal and then this digital signal is stored in an acquisition memory 3 in response to a sampling clock "f" from a sampling control circuit 5, which corresponds to both of a display time period per 1 division of the display screen, and the display data number. The necessary display data portions among the memory contents of this acquisition memory 3 are written into a display memory 4, and thereafter supplied via a display control unit (display data output unit) 9 to a color dot matrix plane display device 7, on which the contents of this acquisition memory 3 are displayed together with character signals derived from a character display memory 6 in accordance with the sequential line scanning. A microcomputer (μ COM) 8 controls overall operations of the digital oscilloscope.

It should be noted that the read/write operations of the signal to be observed with regard to the acquisition memory 3 are performed in response to read/write control signals (R/W) supplied from the sampling control circuit 5. Further, it should be noted that the write operation of the signal to be observed into the display memory 4 is performed in response to a write control signal (W) produced from the sampling control circuit 5, whereas the read operation thereof from the display memory 4 is performed in response to a read control signal (R) from the display control unit 9 corresponding to a display data generator unit.

In this display memory 4, sampled waveform data corresponding to the signals to be observed are stored.

Figure 2:
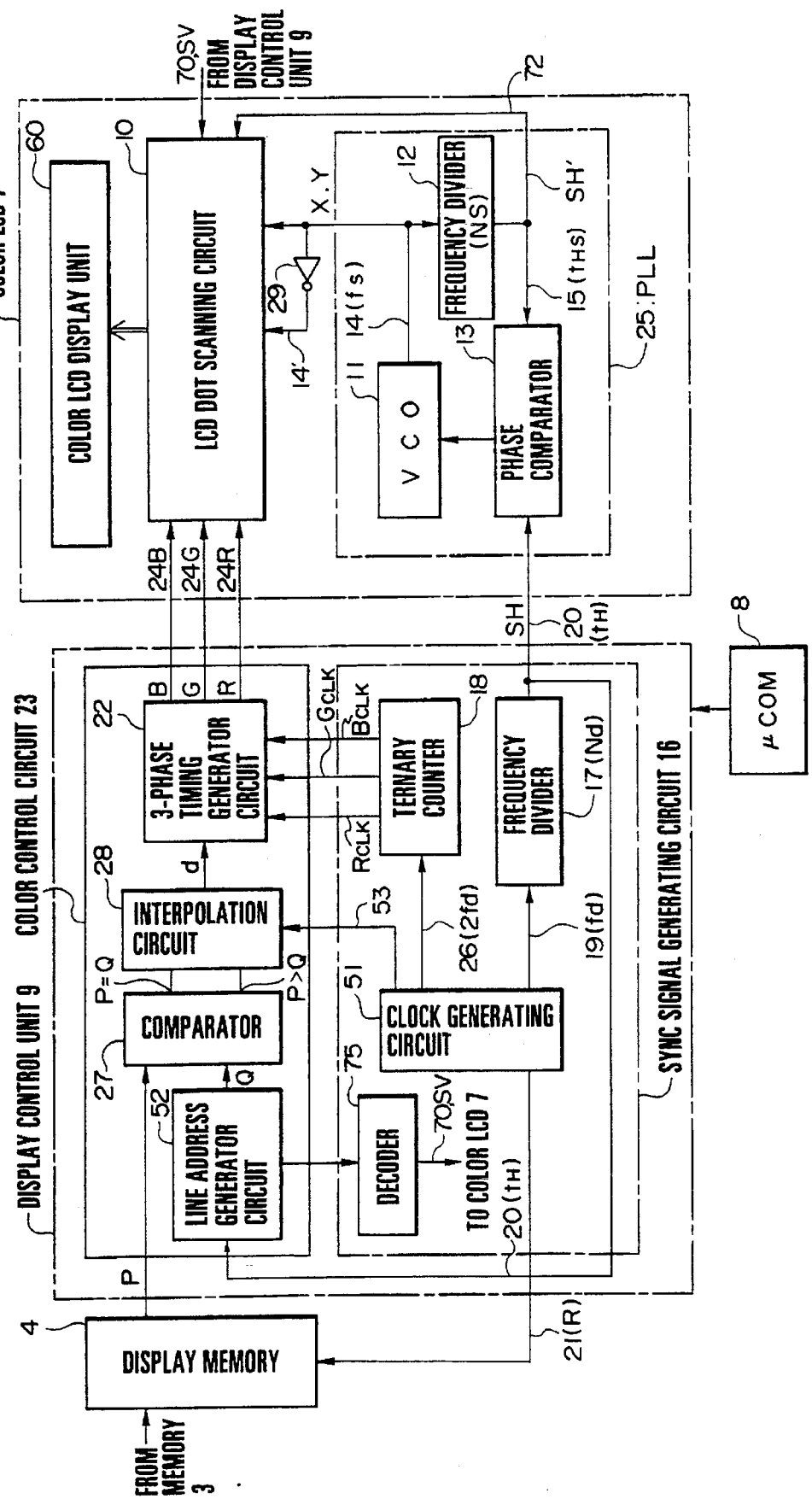
FIG. 2 is a schematic block diagram for showing a major arrangement of the digital oscilloscope according to an embodiment of the present invention.

FIG. 2 is a schematic block diagram of a major arrangement of the digital oscilloscope according to an embodiment of the present invention. This embodiment relates to such a color digital oscilloscope capable of displaying three colors, i.e., red (R), blue (B) and green (G). In FIG. 2, there are shown in detail the arrangements of the display control unit 9 and the color dot matrix plane display device 7 represented in FIG. 1.

It should also be noted that representation of character data from the character display memory 6 shown in FIG. 1 are omitted in the above-described detailed arrangement of FIG. 2. The representations of the character data will be discussed later with reference to FIG. 5B.

In FIG. 2, the color dot matrix plane display device 7 corresponds to, for instance, a color LCD (liquid crystal display) device. The color LCD device 7 includes a color LCD dot scanning circuit 10, a frequency synthesizer, e.g., a phase-locked loop (PLL) circuit 25, an inverter 29, and a color LCD display unit 60. The PLL circuit 25 contains a voltage-controlled oscillator (VCO) 11 for producing a color dot scan clock 14 having a frequency "$f_s$", a frequency divider 12 for dividing the frequency of this color dot scan clock by a frequency diving ratio "$N_S$" ($N_S$ being, for example, 645), and a phase comparator 13 for comparing the output signal (time period "tHS") of the frequency divider 12 with the phase of the horizontal synchronization (sync) signal 20 having the time period "tH" derived from the display control unit 9 to output a deviation. The LCD dot scanning circuit 10 supplies display data 24B, 24G, 24R derived from the display control unit 9 to dots of a color LCD display unit 60 in response to both of the scan clock 14 and another scan clock 14' obtained by processing the first-mentioned scan clock 14 via an inverter 29. The output signal from the frequency divider 12 is supplied as a horizontal synchronization signal SH' to the dot scanning circuit 10. This horizontal synchronization signal SH' is used together with a vertical synchronization signal 70 (will be discussed later) to perform the line sequential scanning operation of the waveform data in the color LCD dot scanning circuit 10. It should be understood that this horizontal sync signal SH' is merely synchronized with the scan clocks 14 and 14', and therefore may be produced by employing other methods.

The display control unit 9 of the digital oscilloscope includes a synchronization (sync) signal generating circuit 16 and a color control circuit 23. The sync signal generating circuit 16 has a clock generating circuit 51 for generating a clock signal 26 having a frequency "2fd" (for example, 20 MHz), a clock signal 19 having a frequency "fd" and other clock signals will be discussed later, and a frequency divider 17 for outputting a clock signal (horizontal sync signal SH) 20 by dividing the clock signal 19 by a frequency dividing ratio Nd (for instance, 645). This sync signal generating circuit 16 further includes a ternary counter 18 for producing 3-phase clock signals $R_{CLK}$, $B_{CLK}$, $B_{CLK}$, $G_{CLK}$ based upon the clock signal 26. The clock generating circuit 51 further generates a read clock signal 21(R) having a frequency fd or fd/3 used to the display memory 4, and another clock signal 53 (STO) having a frequency of, for example, fd or fd/3, which will be supplied to an interpolation circuit 28 of the color control circuit 23. The color control circuit 23 includes a line address generating circuit 52, a comparator 27, the above-explained interpolation circuit 28, and a 3-phase timing generator circuit 22 which sequentially outputs red display data 24R, green display data 24G, and blue display data 24B in response to the 3-phase clock signals.

The line address generating circuit 52 generates the line address in response to the clock signal (horizontal sync signal) 20 produced from the frequency divider 17. The display memory 4 is, for instance, a memory of 8 bits and 2K words, from which the data stored at all of the memory addresses are read out every time 1 horizontal scanning operation of the LCD 7 is carried out. The line address generating circuit 52 sequentially updates an address Q (i.e., horizontal scanning address of LCD display unit 60, corresponding to line number in horizontal direction) in synchronism with the reading operation of the waveform data for 1 vertical scanning period by the display memory 4, and then outputs the updated address Q. In addition, the line address generating circuit 52 generates a vertical sync signal 70 in synchronism with this updated address Q, and supplies the vertical sync signal 70 via a decoder 75 to the LCD dot scanning circuit 10 of the color LCD 7. Based on this vertical sync signal 70 and the above-explained horizontal sync signal 20 supplied from the display control unit 9, the output timing of the display data in the display control circuit 9 is synchronized with the display timing of the waveform data in the color LCD 7. The comparator 27 compares waveform data P derived from the display memory 4 with the address Q generated from the line address generating circuit 52 for every data (256 bits data) along the vertical direction. If the address P is coincident with the address Q, then the address of the data P is output from a P=Q terminal.

This P=Q terminal indicates that the data P to be displayed is present at the address Q generated from the line address generator circuit 52. If the address P is greater than the address Q, then a signal is output from a P>Q terminal. Both of this address P and the output signal are supplied to the interpolation circuit 28.

As described above, the waveform data derived from the display memory 4 are converted in the raster scanning form. Accordingly, the output from the interpolation circuit 28 is interpolated waveform data (display data) d. Detailed operations of this comparator 27 and interpolation circuit 28 will be described in another embodiment. Also, the 3-phase timing circuit 22 will be explained later in detail. It should be noted that the operation of the color control circuit 23 may be replaced by a software process executed by the microcomputer 8, and for example, IC model No. SN-74LS682 of Texas Instruments may employed as the interpolation circuit 28. Since the data supplied to the display memory 4 is identical to the display data used in the well known digital oscilloscope, no detailed description thereof is omitted.

Subsequently, a description will now be made of the color LCD 7 and the display control unit 9. In accordance with the present invention, the horizontal sync signal (SH) 20 is supplied to the color LCD 7, which is produced in the display control unit 9 and determines (synchronizes) the output timings of the display data 24R, 24G, 24B. In the color LCD display unit, the scanning clock signals 14 and 14' for the display data 24R, 24G, 24B are produced in synchronism with this horizontal sync signal 20. Furthermore, in accordance with the present invention, the time period tH of the horizontal sync signal (SH) 20 issued from the display control unit 9 is selected to be equal to the time period (tHS) of the output signal 15 (namely, another horizontal sync signal SH') from the frequency divider 12 employed in the PLL circuit of the color LCD 7. In other words, considering such a relationship of tHS=1/$f_S$×$N_S$ among the frequency $f_S$ of the color LCD dot scan clocks 14 and 14' produced from the PLL circuit 25 of the color LCD 7 shown in FIG. 2, the time period tHZ of the internal signal (horizontal sync signal) 15 of the color LCD 7, and the frequency dividing ratio Ns of the frequency divider 12, a relationship among the time period tH of the horizontal sync signal 20 generated from the sync signal generating circuit 16 of the display control unit 9 of the digital oscilloscope, the frequency dividing ratio Nd of the frequency divider 17 for producing this horizontal sync signal 20, and the frequency fd of the clock signal 19 is defined as 1/fd×Nd=tH=tHS.

That is, the clock frequencies of the display data 24R, 24G, 24B supplied to the color dot matrix display device for displaying waveforms are equal to the frequencies of the scanning clocks 14, 14' of the color dot matrix display device for displaying waveforms multiplied by an integer.

Namely, the frequency dividing ratio Nd of the frequency divider 17 for producing the horizontal sync signal supplied to the color dot matrix display device for displaying waveforms is selected to be the frequency dividing ratio Ns of the frequency divider 12 for producing the internal horizontal sync signal of this color dot matrix display device. It should be noted that time periods tHs and tH are selected to be, for instance, 63.5 microseconds.

By doing so, since the time period tH of the horizontal sync signal 20 of the display control unit 9 becomes substantially equal to the time period tHs of the internal horizontal sync signal of the PLL circuit 25 by way of the PLL circuit 25 of the color LCD 7 shown in FIG. 2, if the dividing ratio Ns of the frequency divider 12 is equal to, for instance, the dividing ratio Nd of the frequency divider 17, then the frequency fd of the output clock 19 from the clock generating circuit 51 becomes equal to the frequency $f_s$ of the oscillator signal from the VCO 11. As a result, the display data is generated in synchronism with the dot scanning of the color LCD 7. Furthermore, the color LCD 7 is operated by the ternary counter 18 and the 3-phase timing generator circuit 22 to display the display data in response to the 3-phase R, G, B display timing signals corresponding to the dot arrangement.

Figure 3:
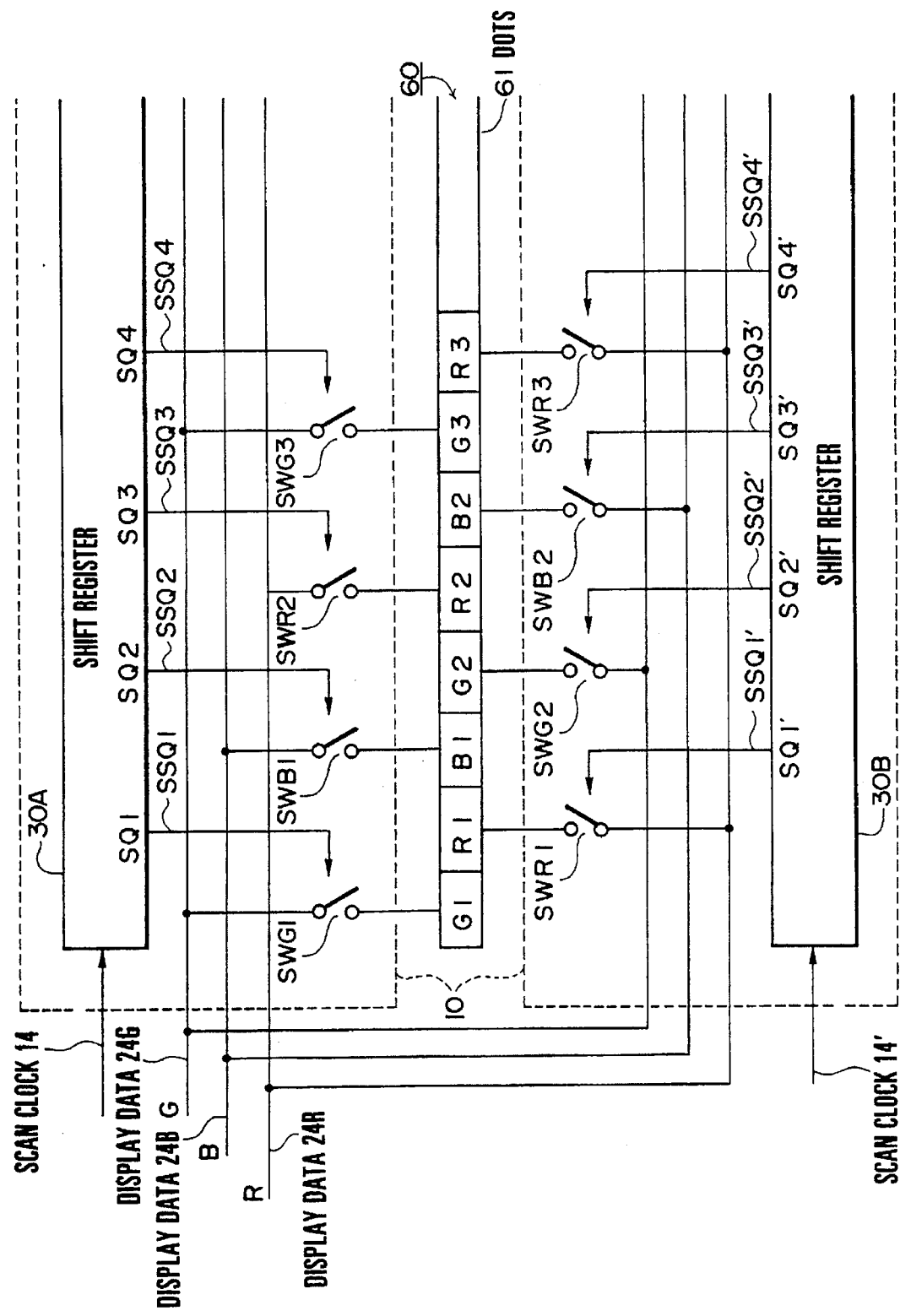
FIG. 3 is a circuit diagram for indicating a circuit portion of the LCD dot scanning circuit shown in FIG. 2.

Then, the specific operation of the color LCD 7 in response to the 3-phase R, G, B display timing signals corresponding to the dot arrangement will now be explained with a specific example to display the display data. In FIG. 3, there is shown a detailed circuit arrangement of this color LCD dot scanning circuit 10 for the color LCD 7. The dot scanning circuit 10 of FIG. 3 includes shift registers 30A, 30B for sequentially turning ON/OFF a switch group of SWG1, SWB1, SWR2, ... another switch group of SWR1, SWG2, SWB2, ... in response to the scan clocks 14 and 14', respectively, and a pair of the above-explained switch groups for selectively applying the display data 24R, 24G, 24B to the dots 61 of the color LCD display unit 60. For the sake of convenience, only a portion of a certain line is represented as the dots 61 of the color LCD display unit 60. Actually, the color LCD display unit 60 owns, for instance, 480 dots along the horizontal scanning direction and 256 dots (namely 256 lines) along the vertical scanning direction. Consequently, one pair of shift registers and one pair of switch groups are provided in correspondence with the respective lines. The switching of these shift registers is carried out for every line in response to the horizontal sync signal 72 (SH), and the switching of the shift registers is performed for every 1 frame (screen) in response to the vertical sync signal 70 (SV).

The operation of the dot scanning circuit 10 will now be explained with reference to FIG. 3 and FIG. 4.

Figure 4:
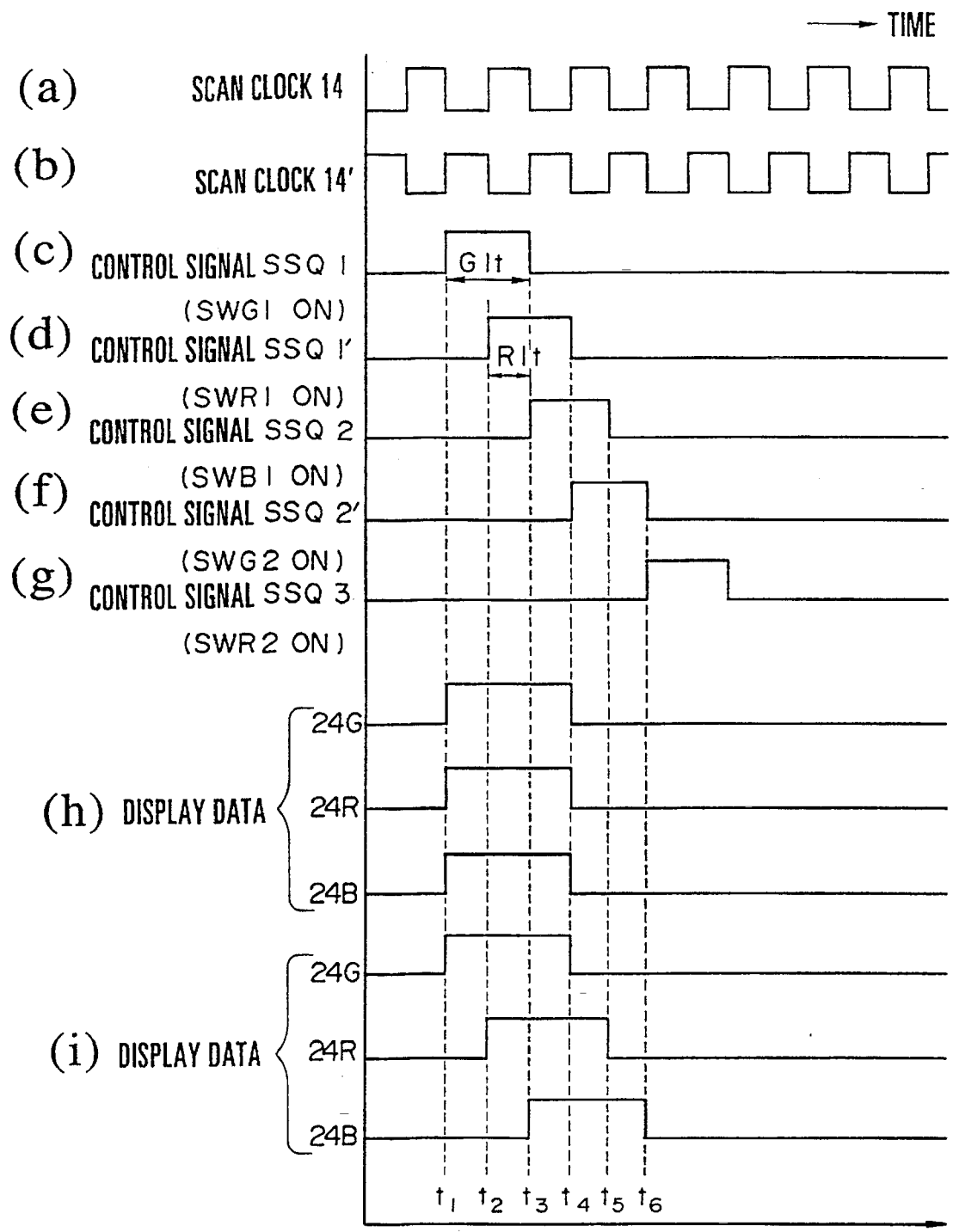
FIG. 4 is a timing chart for illustrating signal waveforms used to explain the operation of the dot scanning circuit shown in FIG. 3.

In synchronism with the scan clock 14 and the scan clock 14' having the reverse phase to the first-mentioned scan clock (see (a) and (b) of FIG. 4), switch control signals SSQ1, SSQ1', SSQ2, SSQ2', and SSQ3 are produced at timings as shown in (c) to (g) of FIG. 4 from output terminals SQ1, SQ1', SQ2, SQ2', SQ3 of the shift registers 30a and 30B. In response to the control signals, the switches SWG1, SWR1, SWB1, SWG2, SWR2 are sequentially turned ON. Then, when the corresponding display data is being supplied to the relevant switch while the respective switches are turned ON, this signal is charged to the corresponding pixel. That is, in response to the high level portion of the control signal SSQ1, the switch SWG1 is turned ON, so that the display data 24G at this time is charged to the green dot G1. Next, in response to the high level portion of the control signal SSQ1', the switch SWR1 is turned ON, so that the display data 24R at this time is charged to the green dot G1. Moreover, in response to the high level portion of the control signal SSQ2, the switch SWB1 is turned ON, so that the display data 24B at this time is charged into the blue dot B1. Subsequently, the display data are charged to the respective dots G2, R2 (red), G3, R3 in a similar manner. It should be noted that the operations by a pair of shift registers 30A and 30B for the dots 61 of the respective lines are normally performed in color LCD displays, and such a circuit arrangement is one of preferable arrangements in view of the matrix-formed arrangement of these dots as well as the display speeds.

On the other hand, in accordance with the present invention, the red, green, blue display data 24R, 24G, 24B are produced from the 3-phase timing generator circuit 24 shown in FIG. 2 with having different timings. This different timing generation is caused by the following reasons:

When, for example, the adjoining dots R, G, B are emitted to display a white display data point, if as illustrated in (i) of FIG. 4 (prior art), the display data 24G, 24R, 24B is produced at the same timing, then the display data 24G is charged into the green dot G1 for time instants $t_1$ to $t_3$ (time period G1t), the display data 24R is charged into the red dot R1 for time instants $t_2$ to $t_4$, but the display data 24B is ended at a time instant $t_4$ during which the switch SWB1 for the dot B1 is being turned ON. As a result, the light emission time of the dot B1 would become a half of that of the dots G1 and R1. Accordingly, the color of the displayed dot is not white.

Then, in accordance with the present invention, as represented in (j) of FIG. 4, the red, green, blue display data 24R, 24G, 24B are generated with having 3 different phase timings by the ternary counter 18 and the 3-phase timing generator circuit 22 shown in FIG. 2. When these display data 24R, 24G, 24B are produced at such different timings, these generation timings are coincident with the ON-timings of the corresponding switches SWR1, SWG1, SWB1. That is, when the switch SWG1 is turned ON, the green display data 24G is generated. When the switch SWR1 is turned ON, the red display data 24R is generated. When the switch SWB1 is turned ON, the blue display data 24B is generated. As a result, the display operation of the display data can be controlled in units of single dot, and the displayed color can be made stable. For instance, one series of waveforms can be displayed as the same color without any blurring phenomenon.

Figure 5A:
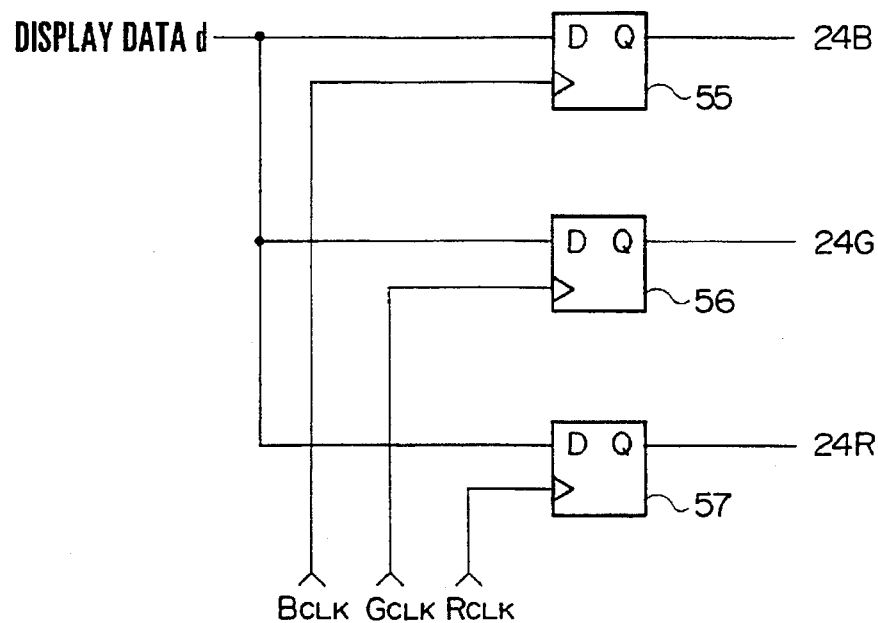
FIG. 5A is a block diagram for indicating one example of an arrangement of the 3-phase timing generator circuit shown in FIG. 2.
Figure 6:
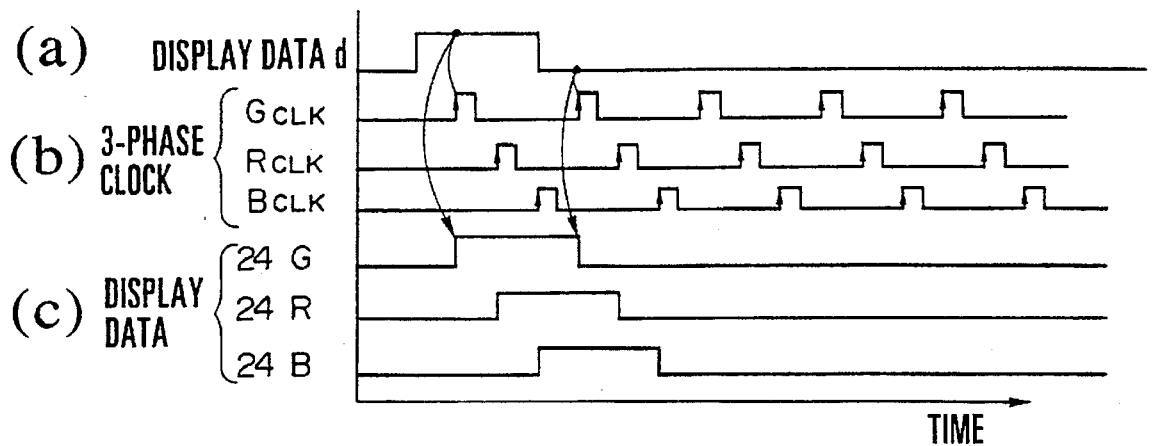
FIG. 6 is a timing chart for representing signal waveforms used to explain operations of the 3-phase timing generator circuit shown in FIG. 5A.

Here, an example of a circuit arrangement of the 3-phase timing generator circuit 22 will now be explained using FIG. 5A and FIG. 6. FIG. 5A represents an example of the 3-phase timing generator circuit 22. FIG. 6 is a timing chart for displaying white display data by using this 3-phase timing generator circuit 22. The 3-phase timing generator circuit 22 owns, for example, 3 D type flip-flops 55 to 57. The 3-phase clock signals $R_{CLK}$, $G_{CLK}$, $B_{CLK}$, (see (c) of FIG. 6) derived from the ternary counter 18 are input to a latch input terminal of each of these D type flip-flops 55 to 57. Consequently, the respective flip-flops 55 to 57 latch and output the display data "d" in response to the corresponding clock signals. Accordingly, these flip-flops 55 to 57 output the display data 24R, 24G, 24B at the timings as shown in (c) of FIG. 4, which are shifted by only one time period of the 3-phase clock signals, respectively.

Figure 5B:
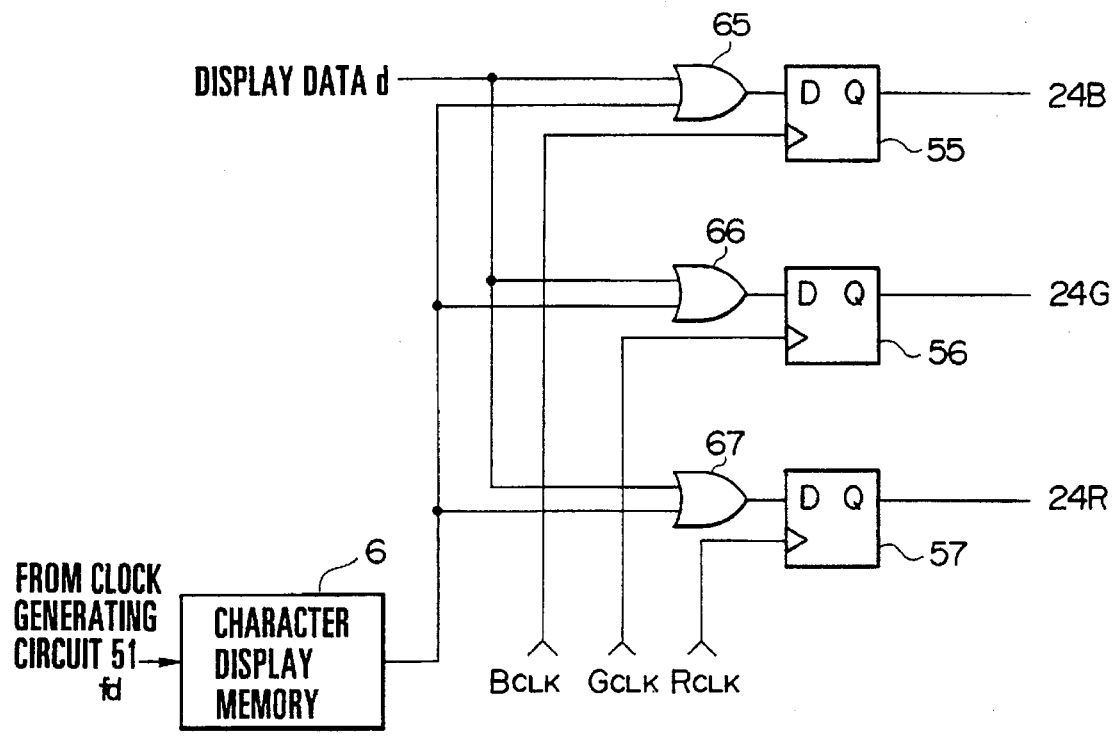
FIG. 5B is a block diagram for representing another example of an arrangement of the 3-phase timing generator circuit shown in FIG. 2.

It should be noted that when the character data read out from the character display memory 6 is displayed in addition to the waveform data derived from the display memory 4, this 3-phase timing generator circuit 22 is arranged as shown in FIG. 5B. That is, OR gates 65, 66, 67 are provided at the data input terminal "D" of the respective D type flip-flops 55, 56, 57. Both the display data "d" and also the character data derived from the character display memory 6 are entered into the data input terminals D of these OR gates, and the outputs of the respective OR gates are supplied to the data input terminals of the corresponding flip-flops.

The reading operation of the character data from the character display memory 6 is carried out in response to the clock signal fd produced from the clock generating circuit 51.

Normally, a color LCD display is arranged in such a manner that dots R, G and B are arranged in a delta form in order to display the television picture.

In the below-mentioned embodiments, such a color LCD display in which the respective dots are arranged in a delta form is employed so as to be capable of displaying waveforms of an oscilloscope with high resolution.

Figure 7:
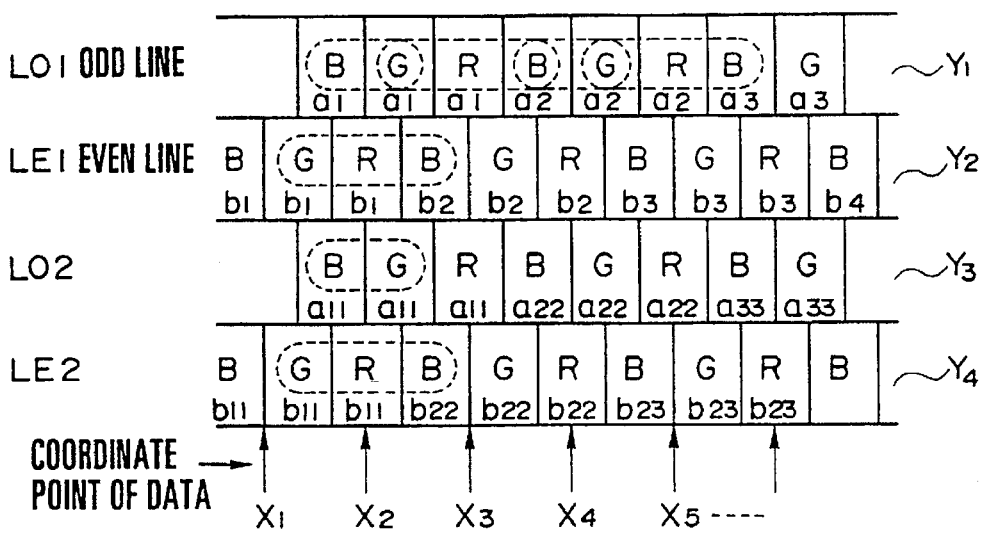
FIG. 7 is a schematic illustration for explaining a display method according to the present invention, performed in a screen of a color LCD display unit where dots are arranged in a delta form.

Then, this feature will now be explained with reference to FIG. 7. FIG. 7 schematically shows a portion of an enlarged screen of a color LCD display. Symbols R, G, B represent red, green, blue dots 61, symbol LO indicates an odd line, and symbol LE denotes an even line.

When, for instance, white is emitted in accordance with the above-explained conventional display method using the display data (see (i) of FIG. 4), the three dots Ba1, Ga1, Ra1 are emitted within one time as a single display unit in the odd line LO1. Subsequently, the three adjacent dots Ba2, Ga2, Ra2 are emitted within one time as a single display unit. Similarly, three dots Bb1, Gb1, Rb1 are emitted within one time as a single display unit, and thereafter, three adjacent dots Bb2, Gb2, Rb2 are emitted as a single display unit within one time. Accordingly, the coordinate points of the data become dots Ga1, Ga2, . . . on the odd line LO1.

As a result, when the dots G, B are emitted to display cyan in accordance with the conventional method, the dots Ba1 and Ga1 constitute a single display unit on the odd line LO1, and the next display unit is the dots Ba2, Ga2 on this odd line, whereas the dots Bb2, Gb2 constitute a single display unit on the even line LE1, and the next display unit is the dots Bb3 and Gb3 on this even line.

For example, a description will now be made of such a case that the dots B and G are emitted and thus the respective coordinate points X2-Y1, X2-Y2, X2-Y3, and X2-Y4 are displayed as cyan-colored vertical (longitudinal) line data.

If the conventional color dot controlling method would be employed, then after the representations of the coordinate X2-Y1 (dots Ba1, Ga1) in the odd line LO1, only the dot R is present on the even line LE1 and the display unit of the dots B and G are not present, so that no dot is displayed. On the coordinate X2-Y3 in the next odd line L02, the dots Ba1l, Ga1l are present as a single display unit, so that the dots are displayed. Furthermore, since only the dot R is present and the dots B and G as the display unit are not present on the coordinate X2-Y4, no dot is displayed. As described above, when the vertical line data is displayed, if the desirable dot is not present at the position corresponding to the coordinate, then this data cannot be displayed.

To the contrary, in accordance with the present invention, for instance when white is displayed, a white display can be realized in the unit of data coordinate point shown in FIG. 7. That is, as previously explained, since the display data 24G, 24B, 24R (see (j) of FIG. 4) for the respective dots are employed whose timings are in synchronism with the turning ON/OFF of the switches SWG, SWB, SWR, assuming now that the frequency of the clock signal 21 read from the clock generating circuit 51 by the microcomputer 8 is selected to be "fd", when white is displayed, the white representations can be performed for each unit of the data coordinate points shown in FIG. 7. In other words, for example, the three dots Ba1, Ga1, Ra1 are emitted as a single display unit in the odd line LO1. Subsequently, the three dots Gb1, Rb1, Bb2, a portion of which are overlapped (Gb1 is overlapped with Rb1), are emitted as the next display unit. Similarly, the three dots Bb1, Gb1, Rb1 are emitted as single display unit in the even line LE1, and thereafter, the three dots Gb1, RB1, Bb2, a portion of which are overlapped (Gb1 is overlapped with Bb1), are emitted as the next display unit. As a result, the coordinate points of the data are dots X1, X2, X3, . . . X4 in the respective lines LO1, LE1 and so on.

Accordingly, as will be described in detail, in another embodiment of the present invention, when cyan is displayed, the frequency of the clock signal 21 read from the clock generating circuit 51 by the microcomputer 8 is selected to be, for example, 2 fd/3. This selected frequency of 2 fd/3 will be described later. In this case, as being surrounded by a dotted line in FIG. 7, for example, the two dots Ba1 and Ga1 in the odd line LO1 are emitted as a single display unit, and subsequently the two partially overlapped dots Ga1 and Ba2 are emitted as the next display unit. Similarly, the two dots Bb1 and Gb1 are emitted as a single display unit, and subsequently the two partially overlapped dots Gb1 and Bb2 are emitted as the next display unit in the even line.

As described above and shown in FIG. 7, when the data coordinate points are set on the same color on both the odd line and the even line, when, for example, the display data is emitted by a pair of the dots B and G, only the number of dots B and G, e.g., only "n" pieces of dots are displayed, observing only one arbitrary line, e.g., odd line. However, since the dots are displayed with being overlapped with the preceding dot group, for example, Ba1, Ga1 and subsequently Ga1, Ba2 in this embodiment, this may be emitted, so that (2×n) pieces of data points can be displayed at maximum. This may be similarly applied to the representations along the horizontal direction.

Assuming now that the frequency of the clock signal 21 read from the clock generating circuit 51 by the microcomputer 8 is selected to be, for example, "fd", emissions of the respective dots can be controlled as a single display unit.

As previously described, according to the present invention, since the display data are processed by 3-phase R, G, B timings, the total number of dots capable of displaying the data may be increased and also the display resolution can be increased as represented in FIG. 7.

Figure 8:
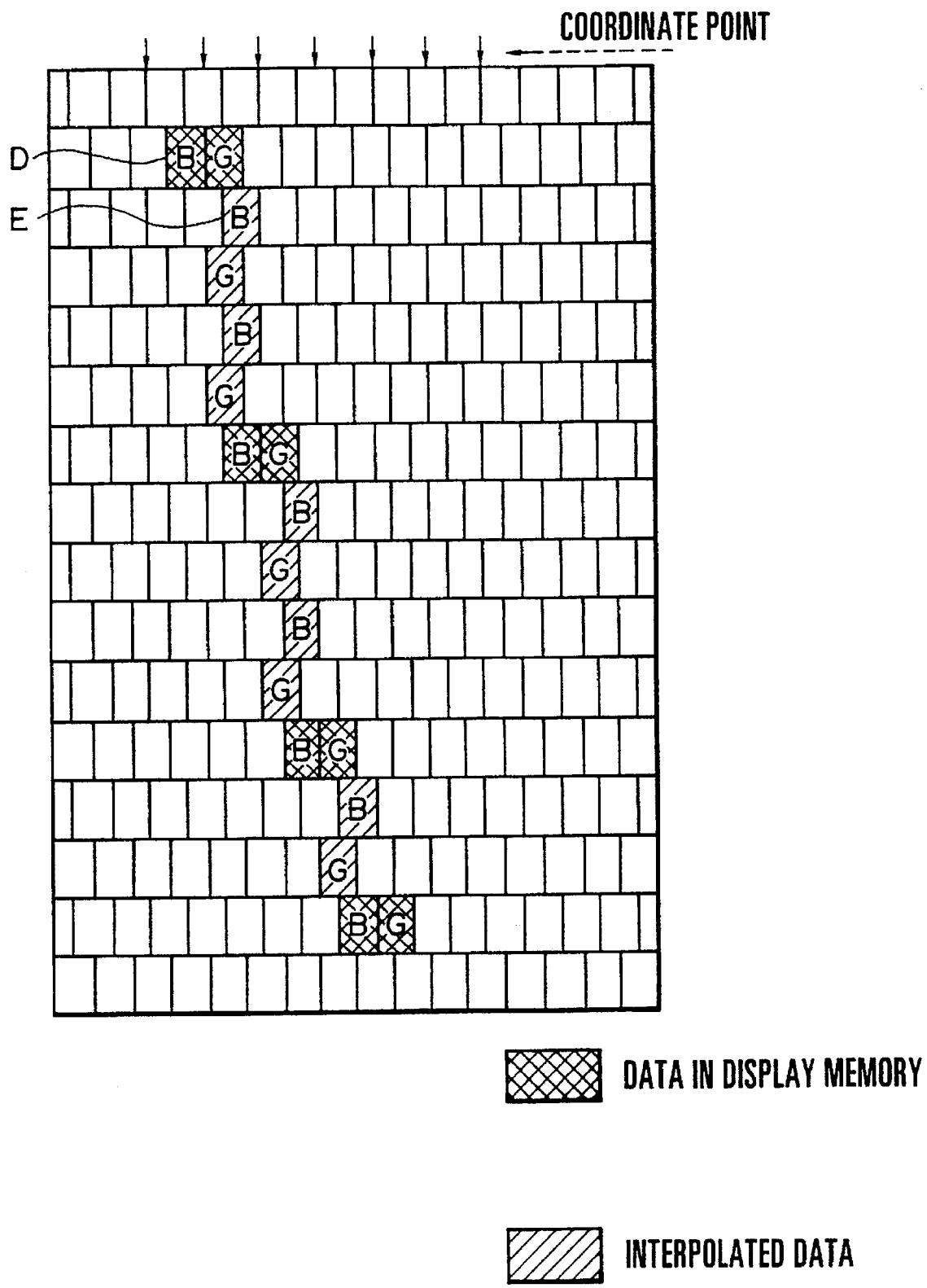
FIG. 8 is a schematic illustration for explaining a data interpolating method according to the present invention, performed in a screen of a color LCD display unit where dots are arranged in a delta form.

Another feature of a further embodiment of the present invention (will be discussed later) is a method for interpolating data. That is, in accordance with the present invention, as illustrated in FIG. 8, when data in one channel are displayed, the data interpolation with respect to the display data along the longitudinal direction (namely, vertical scanning direction) is carried out as follows. When there is at lest one row of dots along the horizontal scanning direction between two adjoining coordinate points in the vertical scanning direction among the continuous coordinate points representative of the waveform data, only one display unit is displayed as a display unit for constituting the waveform, which contains a single dot present at a position in the same horizontal scanning direction as one of the two adjoining coordinate points described above in at least one row of dots along the horizontal scanning direction. In other words, the number of dots to be interpolated is selected to be equal to the number of lines which connect and intersect the display data in the respective lines where the data interpolation should be carried out. As a result, the data interpolation about the waveform data is realized by a sharp narrow line.

When the interpolation of display waveform data is carried out by the conventional method, when a yellow point is emitted by one pair of dots B and G, for instance, as represented in FIG. 9, the interpolated data would become one pair of dots B and G. The interpolated data would become a bold line. It should be noted in FIGS. 8 and 9 that symbol "D" shows waveform data present in the display memory 4 and symbol "E" denotes interpolated data. As apparent from FIG. 8, in accordance with the present invention, a pair of the dot B and G are used to constitute one piece of interpolated data along the longitudinal (vertical) direction, so that the waveform data is represented by a sharp and fine line.

Next, a description will now be made of another embodiment according to the present invention such that, as previously described, the color LCD display in which the dots are arranged in a delta form is employed, the data display according to the present invention is performed using the display data, and also the data interpolation according to the present invention is carried out.

Figure 10:
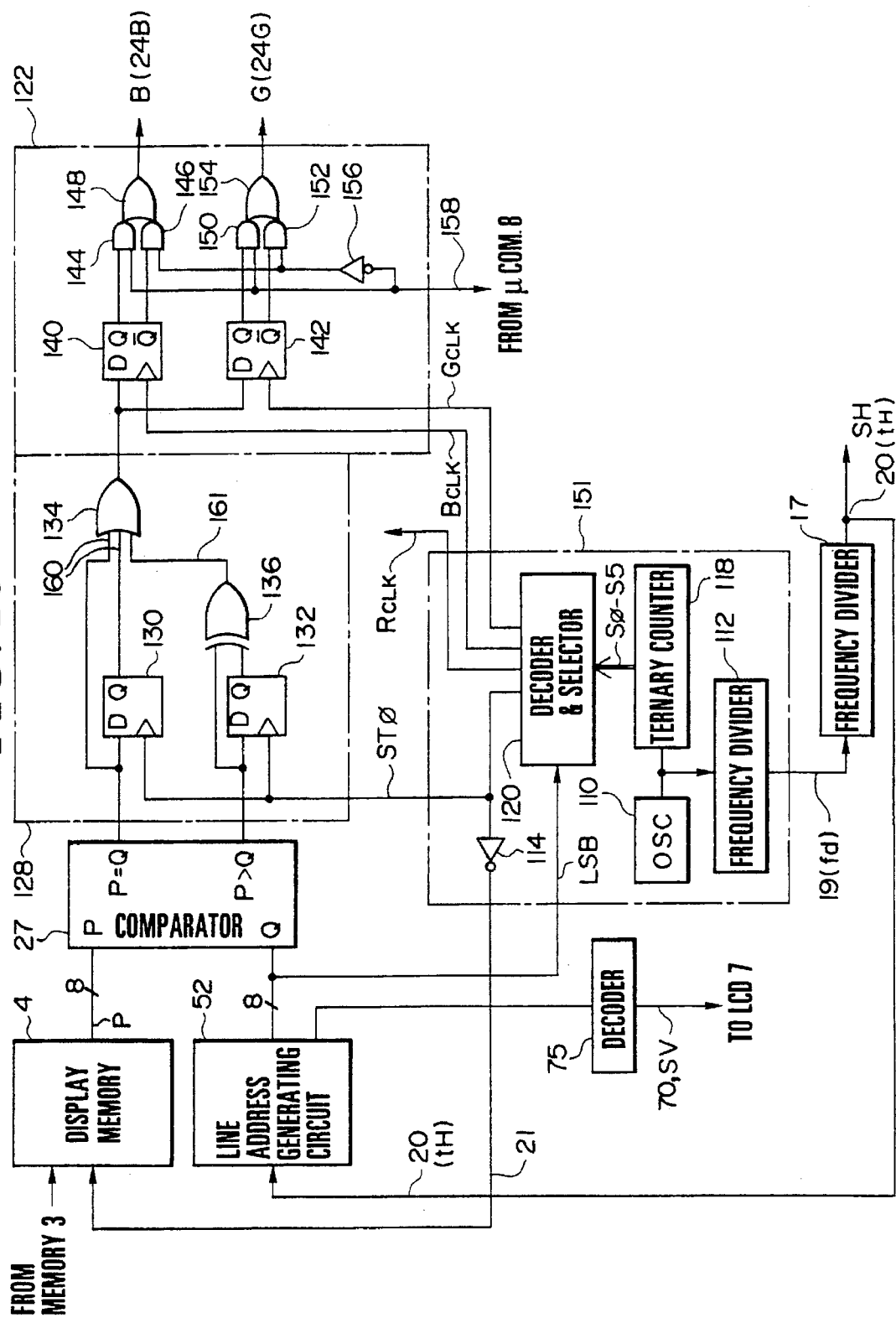
FIG. 10 is a schematic block diagram for representing an arrangement of a display control unit according to another embodiment of the present invention.

FIG. 10 is a block diagram for indicating an arrangement of a display control unit of another embodiment. It should be understood that the same reference numerals shown in FIG. 2 will be employed as those for indicating the constructive elements having the same functions and explanations thereof are omitted. The structure of the color LCD display 7 and other structures are similar to those of the embodiment shown in FIG. 2, and descriptions thereof are omitted. In this embodiment, an explanation will now be made of such a case that, for instance, a green dot (G) and a blue dot (B) are used as a single display unit (display data point, or display coordinate point), and are emitted to display cyan waveform data.

In FIG. 10, a clock signal generating circuit 151 has the functions of both the clock generating circuit 51 and the ternary counter 18. Reference numeral 128 indicates an interpolation circuit, and reference numeral 122 shows a 3-phase timing generator circuit, which own similar functions to those of the interpolation circuit and 3-phase timing generator circuit shown in FIG. 2.

First, an arrangement and an operation of the clock generating circuit 151 will now be explained. The clock signal generating circuit 151 owns an oscillator 110 for oscillating a clock signal having a frequency of, for example, 20 MHz (2d), a frequency divider 112 for frequency-dividing this clock signal by a dividing ratio of ½ to output a clock signal 19 having a frequency of 10 MHz (fd), a ternary counter 118 for outputting 6-phase clock signals S0 to S5, as illustrated in (b) of FIG. 11, by inputting the clock signal derived from the oscillator 110, and also a decoder/selector 120. As indicated in (a) of FIG. 11, these clock signals S0 to S5 correspond to the dots in the odd lines (LO) and the dots in the even lines (LE) within the delta-arranged dots of the color LCD display unit 60.. The clock signals S0 to S5 are supplied to the decoder/selector 120.

The decoder/selector 120 receives the least significant bit (LSB) in the 8-bit address output of the line address generating circuit 52. This LSB indicates the odd line and the even line of the delta-arranged dots of the color LDC display unit 60 along the horizontal scanning direction. For instance, this LSB becomes a high level (H) in case of the even line, and a low level (L) in case of the odd line.

The clock signals $G_{CLK}$ and $B_{CLK}$ applied to the 3-phase timing generating circuit 122 are produced based on the clock signals S0 to S5 and this LSB. FIG. 12A shows one example of a circuit for producing this clock signal, in this case, a circuit for producing the clock signal $G_{CLK}$. This clock signal producing circuit contains two AND gates 121 and 122, an OR gate 123 for inputting therein the outputs from these two AND gates, and an inverter 124 for inverting the LSB to enter the inverted LSB into the AND gate 122. To the AND gate 121, the clock signal S0 and the signal LSB are input, whereas to the AND gate 122, the clock signal S3 and an inverted signal of this signal LSB are entered. In correspondence with the level H or L of the signal LSB, the clock signal $G_{CLK}$ output from the OR gate 123 becomes such clock signals as shown in (d) of FIG. 11, which have different data display timings for the odd line and the even line. In (c) and (d) of FIG. 11, symbols L0 and LE represent the clock signal for the display data in the odd line and the even line.

Figure 11:
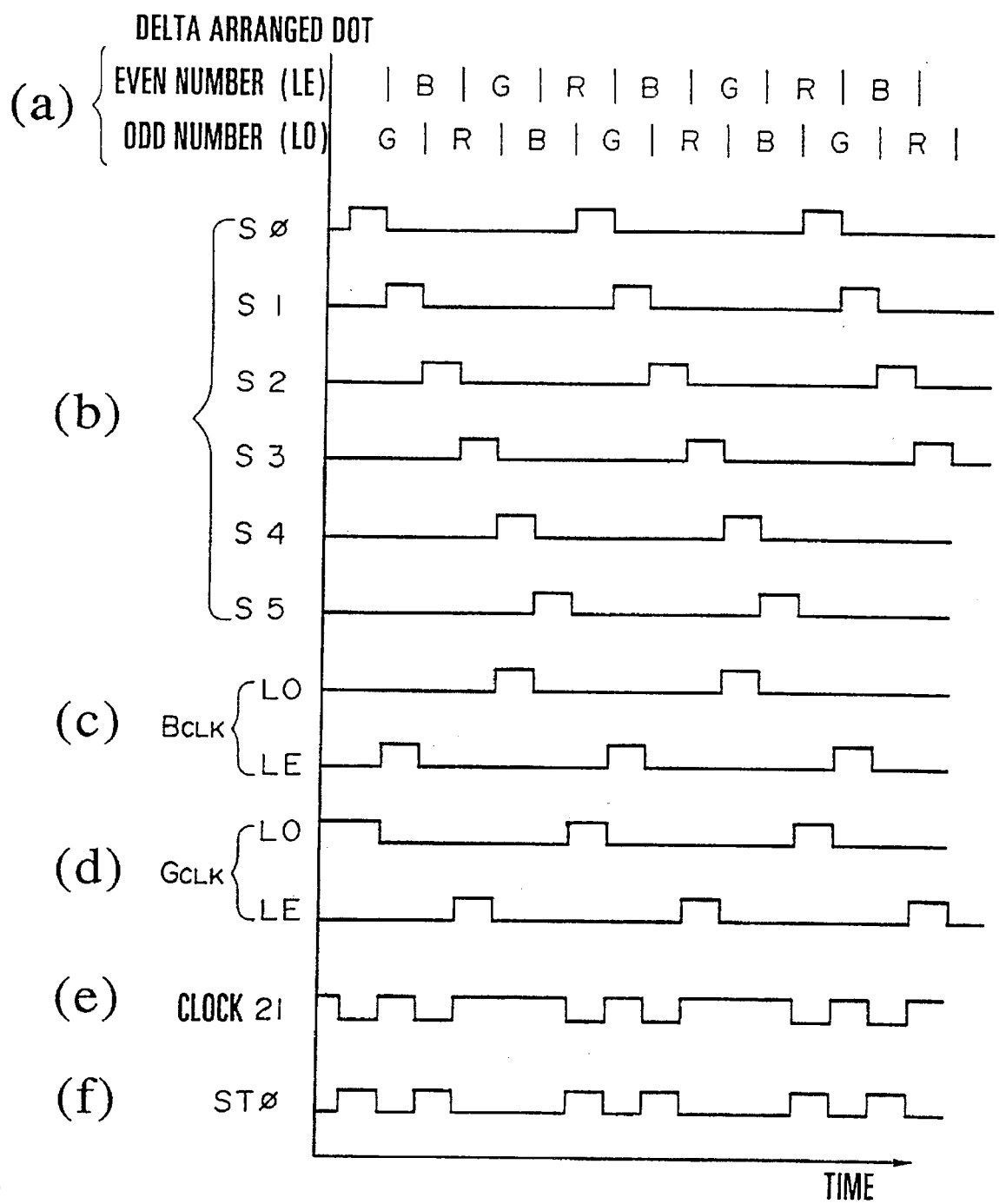
FIG. 11 is a timing chart for representing signal waveforms appearing in various circuit portions, used to explain operations of the clock signal generating circuit employed in the display control unit of FIG. 10.
Figure 12A:
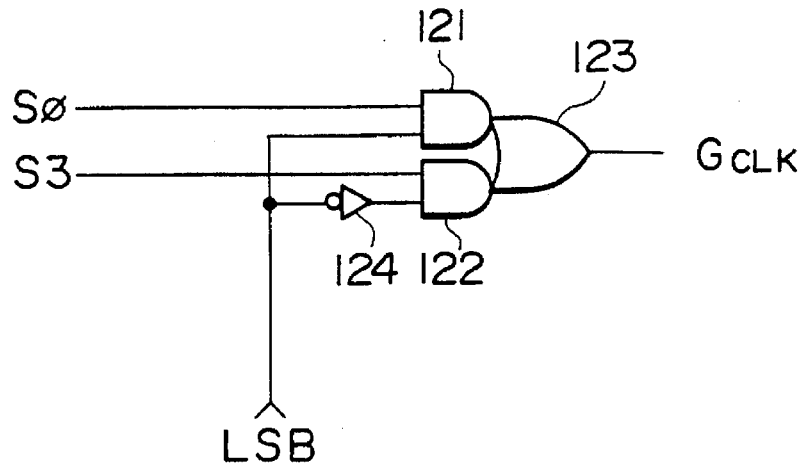
FIGS. 12A and 12B are circuit arrangements of major portions of the clock signal generating circuit shown in FIG. 10.

Another clock signal $B_{CLK}$ (see (d) of FIG. 11) may be generated by using a similar circuit arrangement employing the clock signals S4, S1 and the signal LSB. It should be noted although the clock signal $R_{CLK}$ is not employed in this embodiment, this clock signal may be produced by using a similar circuit arrangement with employment of the clock signals S2 and S5 and the signal LSB.

Figure 12B:
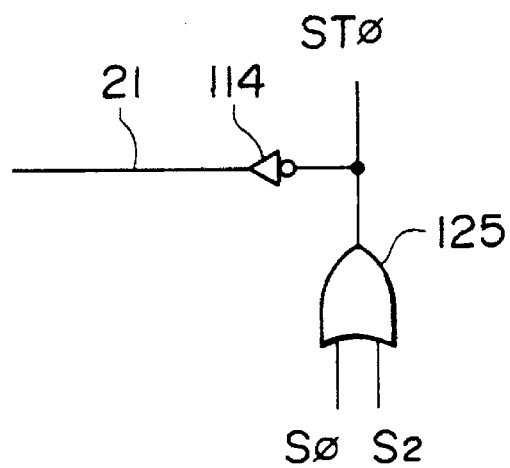

As illustrated in FIG. 12B, the clock signal STO supplied to the interpolation circuit 128 may be obtained from, for instance, an output signal of the OR gate 125 into which the clock signals S2 and S4 are input. A clock signal 21 produced by inverting this clock signal STO via an inverter 114, is supplied to the display memory 4 as a read clock signal. Since the red dot is not emitted in this embodiment, this clock signal 21 is not produced as a clock pulse corresponding to the red clock $R_{CLK}$ (namely, red display data 24R) among the 3-phase clocks. For the sake of convenience, the frequency of such a clock signal 21 is defined as 2fd/3.

Next, a description will now be made of an arrangement and operation of the display control unit 9 when two color dots are displayed in this embodiment.

Figure 13:
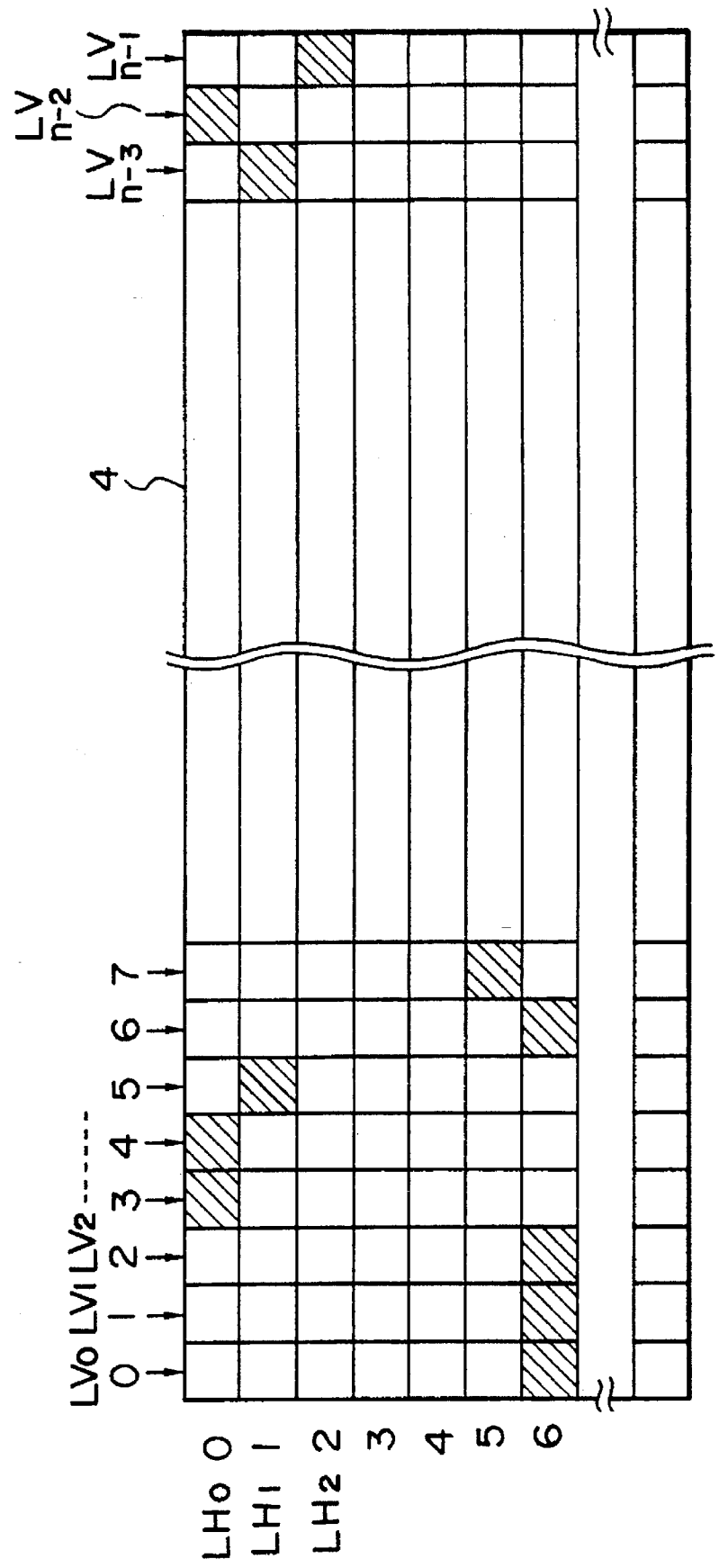
FIG. 13 schematically indicates one example of a structure of the waveform memory shown in FIG. 10.

FIG. 13 schematically shows an example of waveform data stored in the display memory 4. In this example, the display memory 4 owns "n" data (e.g., 320 data) along the horizontal scanning direction in correspondence with the color LCD display unit 60. Each data is 8 bits. That is, in this case, the LCD display unit 60 owns 480 dots along the horizontal scanning direction 256 dots (256 lines) along the vertical scanning direction. In FIG. 13, a hatched portion indicates waveform data to be displayed (namely, waveform display data). The waveform display data is written from the acquisition memory 3 into the display memory 4. The waveform display data are sequentially read out from the display memory 4 in response to the clock signal 21 ((e) of FIG. 11) in such a manner that 8 bits data along the vertical scanning direction are read as one unit as 8-bit parallel data. In other words, the waveform data are read in response to the clock signal 21 for the respective lines LV0 and LV1 along the vertical scanning direction as shown in FIG. 13. Thus, within one horizontal scanning period as shown in (c) of FIG. 14, all of the data stored in the display memory 4 are read out, and then supplied to the comparator 27 as waveform data (see (b) of FIG. 14). This one horizontal scanning period corresponds to a time period tH, i.e., 645 clocks. It should be noted that actually 320 data (time period corresponding to 480 clock signals 19) are displayed, and the time period corresponding to 165 clock signals 19 is a blanking period. In this display memory 4, the read operation for all of the waveform data performed within 1 horizontal scanning period tH is repeatedly carried out by the total number of vertical scanning lines of the LCD display unit 60, namely 256 times. In other words, the read operation for all of the waveform data is repeatedly performed 256 times within one vertical scanning period. When this read operation is carried out, the subsequent waveform display data are input into the display memory 4 from the acquisition memory 3.

Figure 14:
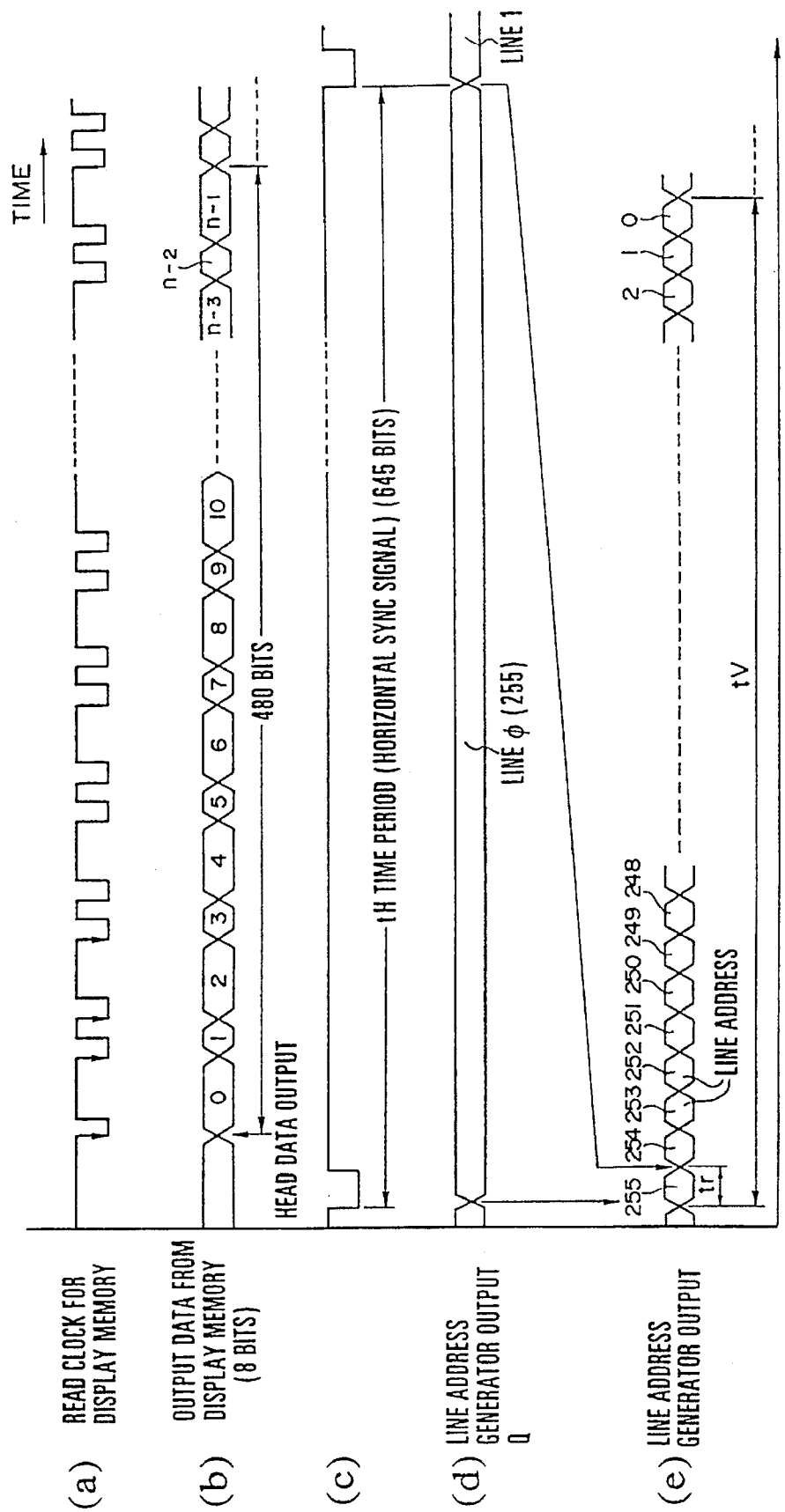
FIG. 14 is a timing chart for representing signal waveforms appearing in various portions, used to explain the reading operation of the waveform memory shown in FIG. 13.

The line address generating circuit 52 is an 8-bit binary down counter for counting, for instance, a clock signal 20 (see (c) of FIG. 14) corresponding to the horizontal sync signal. Accordingly, this binary down counter counts 255 up to 0 within one vertical scanning period tV, and is reset in response to the next horizontal sync signal, so that the count value becomes 255, and further produces the vertical sync signal 70. As a result, the line address generating circuit 52 outputs the address indicative of the line under scan (LH0 to LHn of FIG. 13) in the LCD display unit 60.

Figure 15:
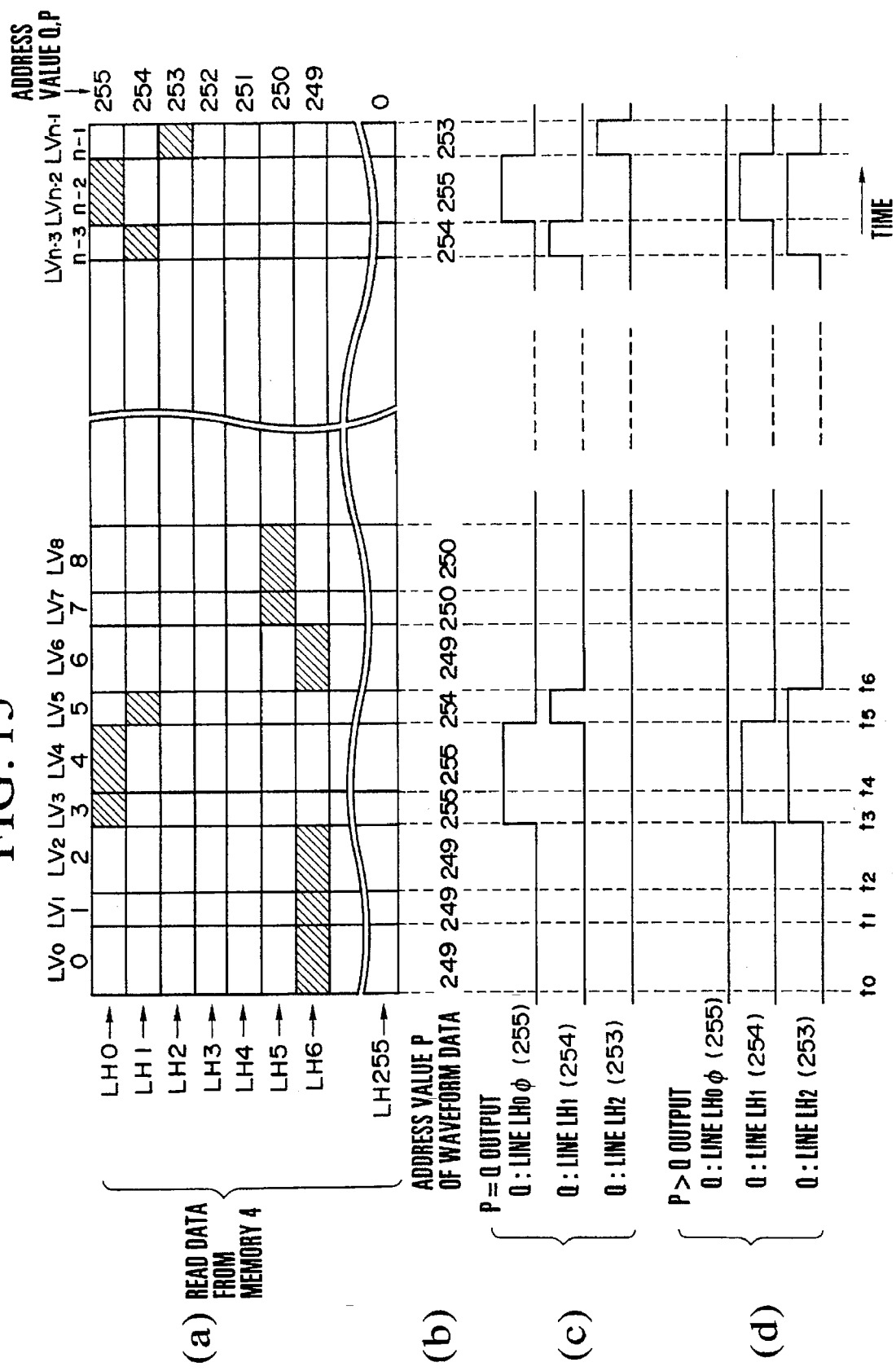
FIG. 15 is a timing chart for indicating various signal waveforms used to explain operations of the comparator shown in FIG. 10.

Referring now to FIG. 15, an operation of the comparator 27 will be explained. (a) of FIG. 15 shows waveform display data "p" read out from the display memory 4, and a hatched portion thereof represents that the waveform data to be displayed is present. First, a description is made of such a condition that the output address Q derived from the line address generating circuit 52 is a value of 255 indicative of the horizontal scanning line LH0. When the waveform data in the line LV0 is read out (time instant $t_a$), since the waveform data "p" is present in the line LH6 in case of FIG. 15, the value of the data is 249. The data values of the waveform data "P" in the subsequent lines LV1, LV2, LV3, LV4 are 249, 249, 255, 255 respectively. The comparator 27 compares the address of the data "P" with the address Q for each of the waveform data in the respective lines LV0, LV1, . . . If the first address is coincident with the second address Q, then the level of the output signal derived from the P=Q terminal of this comparator 27 is set to a high level. If P>Q, then the level of the output signal derived from the P>Q terminal of this comparator 27 is set to a high level. In other cases, the level of this output signal is set to a low level. As a result, as represented in (c) and (d) of FIG. 15, the output signals from the P=Q terminal and the P>Q terminal of the comparator are changed. In this manner, when the output address Q indicates the value (255) of the horizontal scanning line, if the comparison operation as to all of the lines LV0 to LVn-1 has been accomplished, then the output address Q which is subsequently output represents the value (254) of the subsequent horizontal scanning line LH1, and the comparison operation is similarly carried out also in this case.

The output signals derived from the P=Q terminal and the P>Q terminal of the comparator 27 are supplied to the interpolation circuit 128. The foregoing description relates to such an operation that the display data of the memory 4 are read as the raster scanning manner.

As represented in FIG. 10, the interpolation circuit 128 includes, for instance, D type flip-flops 130 and 132, an OR gate 134, and an exclusive OR gate circuit 136. The clock signal STO derived from the clock signal generating circuit 151 is supplied to latch inputs of the respective flip-flops 130 and 132, and output signals of the P=Q terminal and the P>Q terminal of the comparator 27 are supplied to data inputs D of the respective flip-flops 130 and 132.

The 3-phase timing generator circuit 122 owns, for example, D type flip-flops 140, 142 having data inputs D to which the output from the OR gate 134 is input; AND gates 144, 146 into which both the Q output of this flip-flop 140 and the Q output thereof are entered; and an OR gate 148 to which the outputs of these AND gates 144, 146 are input. The 3-phase timing generator circuit 122' further includes AND gates 150, 152 into which the Q output of the flip-flop 142 and the Q output thereof are input; an OR gate 154 into which the outputs of these AND gates 150 and 152 are entered, and an inverter 158. An inverted display control signal 158 derived from the microcomputer 8 is supplied to the other inputs of the AND gates 144 and 150, and this control signal is supplied via an inverter 156 to the other inputs of the AND gates 146 and 152. When this inverted display control signal 158 has a low level, it implies the normal display (in this case, background color is black, and a waveform is displayed as a cyan luminescent point), whereas when this inverted display control signal 158 has a high level, it implies the reverse display (in this case, background color is white and a waveform is displayed as a black point).

Operations of the interpolation circuit 128 and the 3-phase timing generator circuit 122 will now be explained with reference to FIG. 16 and FIG. 17. In the interpolation circuit 128, a signal 160 representative of an OR-gated result between the output from the P=Q terminal of the comparator 27 and the output from the Q output terminal of the flip-flop 130 in the OR gate 134, indicates the waveform display data read out from the display memory 4. On the other hand, an output signal 161 from the exclusive OR circuit 136 indicates interpolated data.

Based on these signals 160 and 161, the 3-phase timing generator circuit 122 outputs the display data B, G (display point data: data indicative of a point to be displayed as a waveform) (24B, 24G) in accordance with the waveform data read out from the display memory 4, and further outputs the display data B, G (24B, 24G) in accordance with the interpolated data.

A first explanation will now be made of the generation/display of the display data B, G (24B, 24G) based on the waveform display data read out from the display memory 4 with reference to FIG. 16. (a) of FIG. 16 shows the display data in the lines LH0, LH1, LH6 derived from the P=Q output terminal of the comparator 27. (b) of FIG. 16 represents the signal 160 in the lines LH0, LH1, LH6. (c) of FIG. 16 indicates the signal STO derived from the decoder/selector 120. (d) of FIG. 16 represents the clock signal $B_{CLK}$ used for the odd line and the even line and derived from the decoder/selector 120. (e) of FIG. 16 shows the clock signal $G_{CLK}$ used for the odd line and the even line. (f) of FIG. 16 shows the output display data B, G (24B, 24G) in the odd line LH0. (g) of FIG. 16 denotes the output display data B, G (24B, 24G) in the odd line LH1. (h) of FIG. 16 indicates the output display data B, G (24B, 24G) in the even line LH6. (i) of FIG. 16 shows a display screen of the LCD display unit 60. It should be understood that the output timings of the display data B, G shown in (f) to (h) of FIG. 16 are indicated in correspondence with the emitting timing of the display data on the display screen, as shown in (i) of FIG. 16. This timing corresponding relationship is similarly applied to that of FIG. 17.

For instance, an explanation of the blue display data in the even line LH0 will now made. In this case, the signal 160 processed in the flip-flop 140 corresponds to the data indicated in (1) of (b) of FIG. 16, and the clock signal $B_{CLK}$ corresponds to a clock signal represented in (2) of (d) of FIG. 16. At a time instant "$t_3$" when this clock signal rises up, the signal 160 is latched. However since the signal 160 is at the low level, the output display data B is also at the low level. Subsequently, at a time instant "$t_5$" when this clock signal rises up, since the signal 160 is at the high level, the output display data B is also at the high level. At a time instant "$t_7$" when this clock signal rises up, since the signal 160 becomes the low level, the output display data B also becomes the low level. As a result, the display data in the line LH0 becomes the high level between the time instant $t_5$ and the time instant $t_7$. Accordingly, the blue dot 502 corresponding to the coordinate X4 is emitted in the LCD display unit 60.

Figure 16:
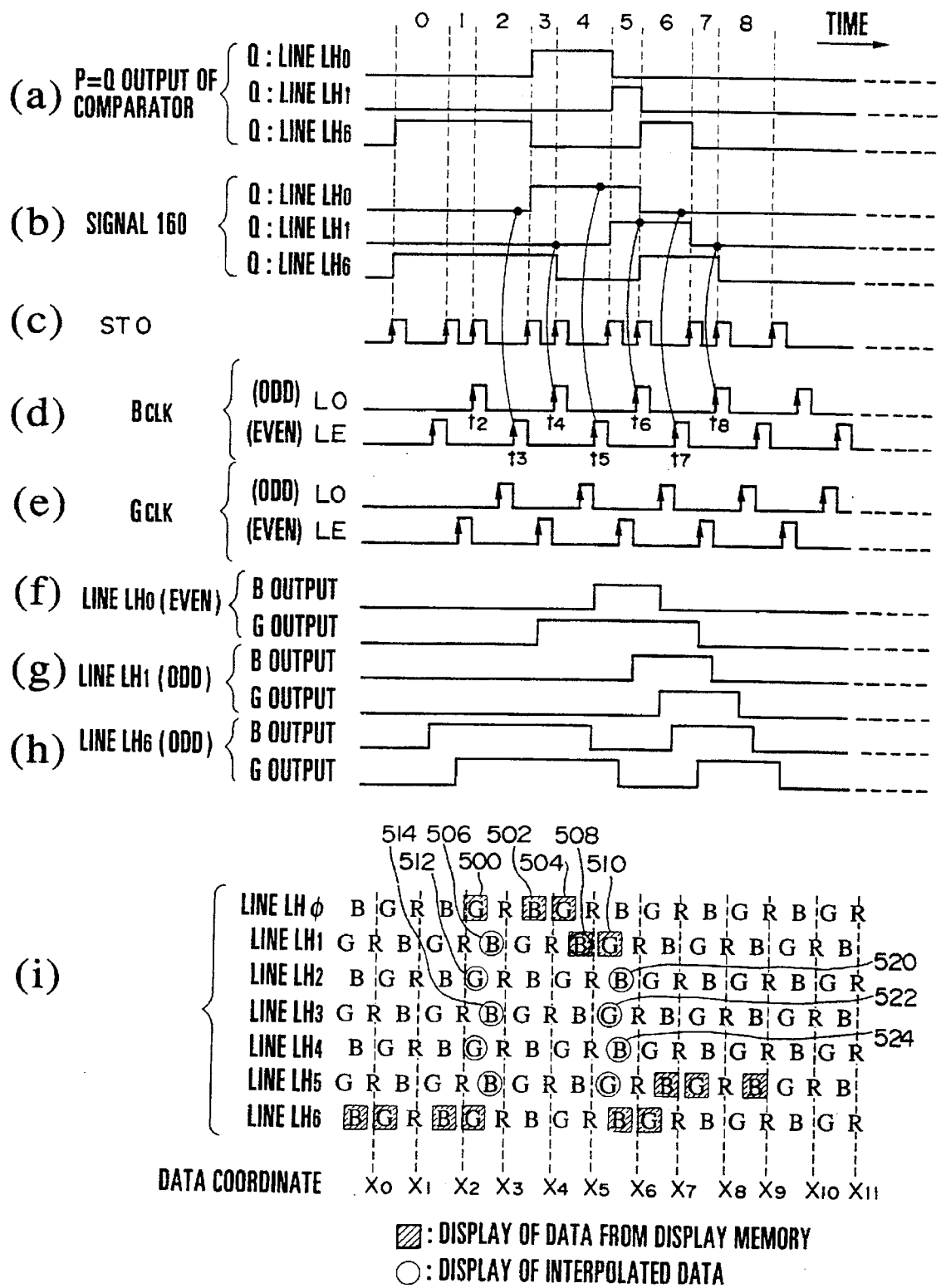
FIG. 16 is a timing chart for representing signal waveforms appearing in various circuit portions, used to explain a display data generating operation based on display data derived from the interpolation circuit and the waveform display memory in the 3-phase timing generator circuit of FIG. 10.

In accordance with a similar manner to above, the blue display data in the odd line (e.g., LH1) is produced based upon the data shown in (2) of (b) of FIG. 16 which is input into the flip-flop 140, and the clock signal $B_{CLK}$ indicated by (1) of (d) of FIG. 16.

Similarly, the green display data is produced based on the signal 160 and the clock signal $G_{CLK}$, which are input to the flip-flop 142.

As indicated by a hatched (inclined) line of (i) of FIG. 16, the blue and green dots (B, G) 500, 504, 508, 510 and so on are emitted in accordance with the above-described manner. Accordingly, as represented by a hatched line shown in this drawing, the dots are emitted by the display data B, G (24B, 24G) based on the waveform display data read from the display memory 4. It should be noted that the display data B and G surrounded by a circle of FIG. 16$i$ represent display dots based upon the interpolated data.

Figure 17:
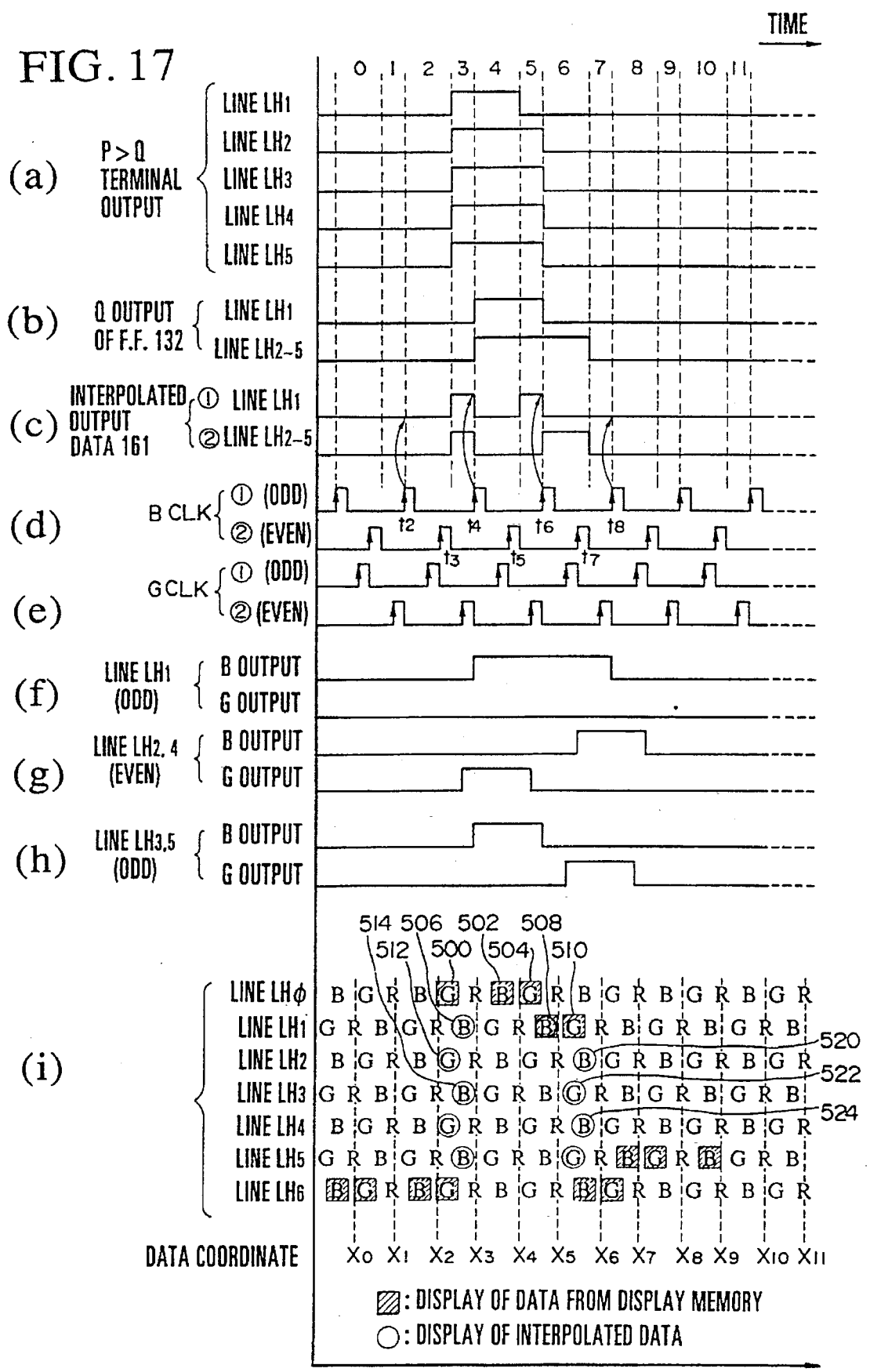
FIG. 17 is a timing chart for representing signal waveforms appearing in various circuit portions, used to explain a display data generating operation based upon interpolation data derived from the interpolation circuit and the 3-phase timing generator circuit of FIG. 10.

Referring now to FIG. 17, generations/displays of the display data B, G (24B, 24G) based on the interpolated data will be explained.

(a) of FIG. 17 represents the display data in the lines LH1 to LH5 derived from the output terminal P>Q of the comparator 27. It should be noted that since no interpolation is carried out in the uppermost line LH0 and the lowermost line LH255, no interpolated data about these lines are output from the output terminal P>Q thereof. (b) of FIG. 17 represents the Q outputs of the flip-flop 132 for the lines LH to LH5. (c) of FIG. 17 shows the interpolated data signals 160 with regard to the lines LH to LH5. (d) of FIG. 17 represents the clocks signals $B_{CLK}$ for the odd line and the even line derived from the decoder/selector 120. (e) of FIG. 17 indicates the clock signal, $G_{CLK}$ for the odd line and the even line. (f) of FIG. 17 represents the interpolated display data B, G (24B, 24G) for the odd line LH1. (g) of FIG. 17 denotes the interpolated display data B, G (24B, 24G) for the even lines LH2 and LH4. (h) of FIG. 17 shows the interpolated display data B, G (24B, 24G) for the odd lines LH3 and LH5. (i) of FIG. 17 indicates a display screen of the LCD display unit 60.

A description will now be made of, for example, the blue interpolated display data in the odd line LH1. In this case, the signal 161 processed in the flip-flop 142 corresponds to the data indicated in (1) of (c) of FIG. 17 and the clock signal $B_{CLK}$ corresponds to a clock signal represented in (1) of (d) of FIG. 16. At a time instant "$t_2$" when this clock signal rises up, the signal 161 is latched. However since the signal 161 is at the low level, the interpolated display data B is also at the low level. Subsequently, at a time instant "$t_4$" when this clock signal rises up, since the signal 161 is at the high level, the interpolated display data B is also at the high level. At a time instant "$t_6$" when this clock signal rises up, since the signal 161 becomes the high level, the interpolated display data B remains at the high level. Next, at a time instant "$t_8$" when the clock signal rises up, since the signal 161 becomes the low level, the interpolated display data B also becomes the low level. As a result, the interpolated display data B in the line LH1 becomes the high level between the time instant $t_4$ and the time instant $t_8$. Accordingly, the blue dot 506 corresponding to the coordinate X3 is emitted in the LCD display unit 60.

Likewise, as illustrated by a circle in (i) of FIG. 17, the blue and green dots (B, G) 508, 512, 514, 520, 522, 524 and so on are emitted. Thus, as represented by a circle of this drawing, the dots are emitted based on the display data B, G (24B, 24G) in response to the interpolated waveform display data.

As apparent from FIG. 16 and (i) of FIG. 17, a single display unit of the coordinate X3 is constituted by one pair of blue and green dots 500 and 502 along the horizontal direction, and a pair of dots 502 and 504 become a display unit of the coordinate X4. On the other hand, since one waveform line displayed by the interpolated data along the vertical direction is displayed by a single dot in the respective lines LH1 to LH5, the waveform data can be displayed by a sharp and fine line.

Figure 18:
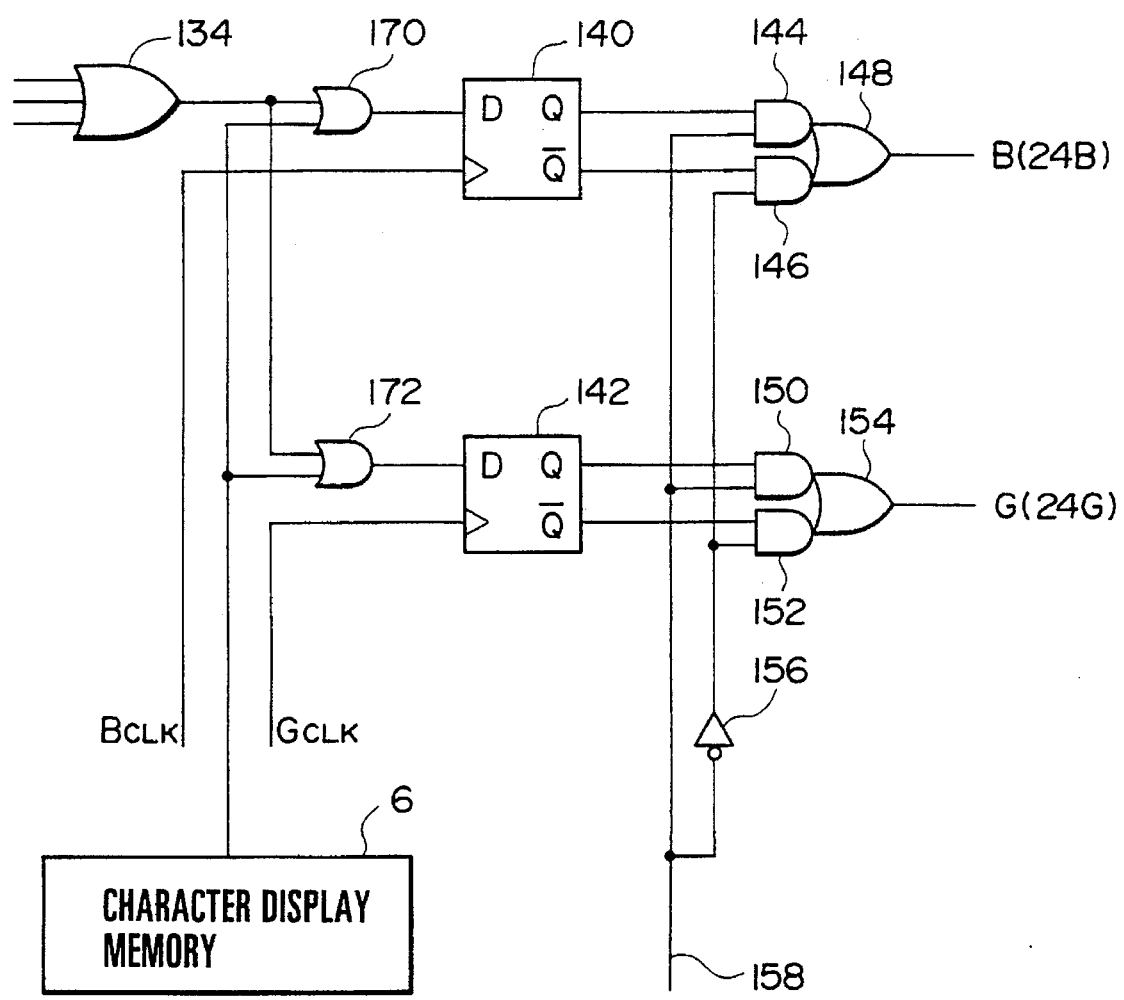
FIG. 18 is a schematic block diagram for indicating another circuit arrangement of the 3-phase timing generator circuit shown in FIG. 10.

When the character data read out from the character display memory 6 is also displayed in addition to the waveform data derived from the interpolation circuit 128 in the other embodiment shown in FIG. 10, a 3-phase timing generator circuit 122 is arranged as shown in FIG. 18. That is, OR gates 170 and 172 are provided at data inputs D of the respective D type flip-flops 140 and 142, the output display data from the OR gate 134 is entered together with the character data derived from the character display memory 6 into the inputs of the respective OR gates, and the outputs from the respective OR gates are input to the data input D of the corresponding flip-flop.

Although the cyan data is displayed by emitting the blue dot and the green dot in the above-explained embodiment, the color data made by combining other two color dots may be readily realized by utilizing the clock signal $R_{CLK}$.

Next, various data display methods to which the present invention has been applied will now be described.

Figure 19:
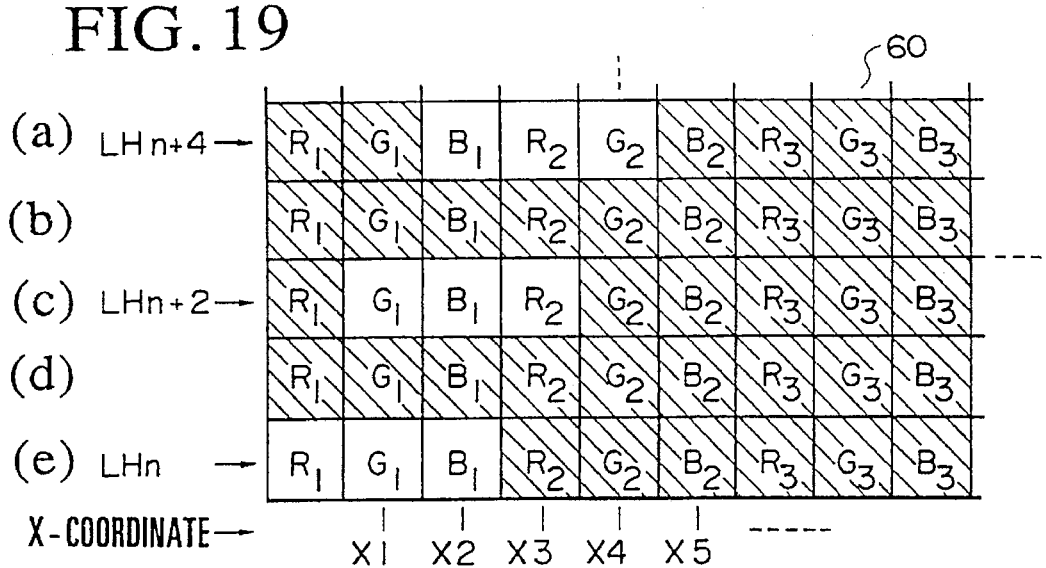
FIG. 19 schematically illustrates another example of the data display method performed on the screen of the color LCD display unit, to which the present invention is applied.

In an example shown in FIG. 19, assuming now that a first pixel group of each of lines (LH) along the horizontal scanning direction is R1, G1, B1, and a second pixel group thereof is R2, G2, B2, these dot groups are emitted, for instance, for every 1 horizontal scanning line. As an example, a first pixel group of the dots R1, G1, B1 in a line LHn is emitted by the first applied data, both a first pixel group in a line $LH_{n+2}$ and a second pixel group of a portion of dots G1, B1, R2 are emitted by the second data, and both a first pixel group in a line $LH_{n+4}$ and a second pixel group of a portion of the dots B1, R2, G2 are emitted by the third data. In other words, since there are coordinate axes corresponding to the respective dots R, G, B, the R, G, B pixel groups emitted by the applied data are emitted as partially overlapped groups.

Figure 22:
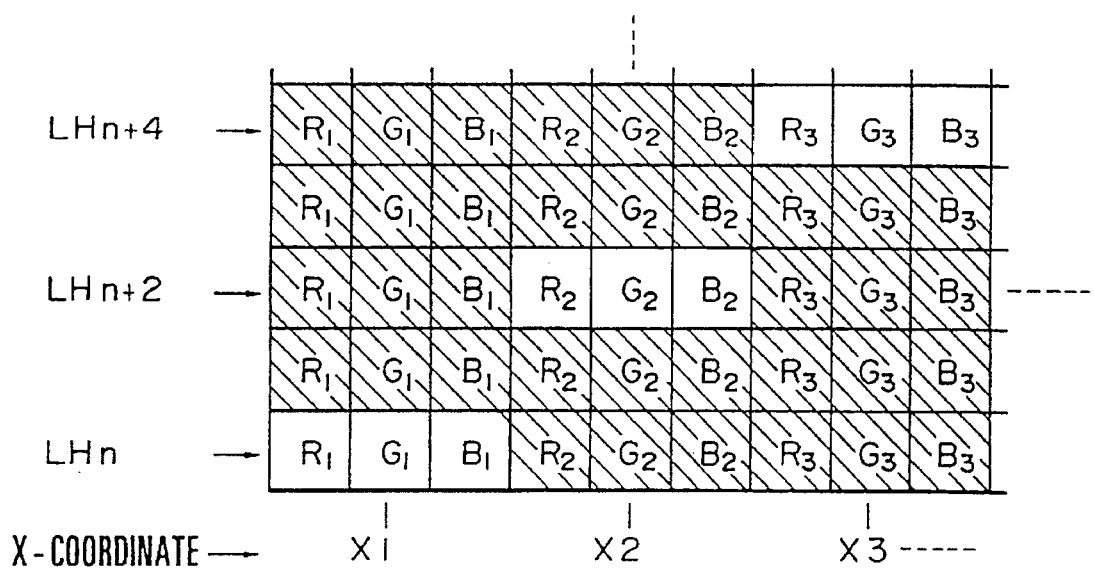
FIG. 22 is an explanatory diagram for explaining one example of the conventional data display method performed on the screen of the color LCD display unit.

Since the horizontal display resolution is achieved by this display method such that the emission of one group of the dots R, G, B is carried out in unit of resolution (resolution indicated by the coordinates X1, X2, X3, X4, X5, ... shown in FIG. 19), this horizontal display resolution is increased three times greater than that achieved by the conventional display method, as previously explained in FIG. 22.

For example, when the waveform shown in FIG. 19 would be displayed in accordance with the display method of FIG. 22, although the pixels R, G, B in the line LHn of FIG. 18 could be displayed, the pixels in the line $LH_{n+2}$ and the line $LH_{n+4}$ would not be displayed so that the displayed waveform could not be observed as a continuous line.

Figure 20:
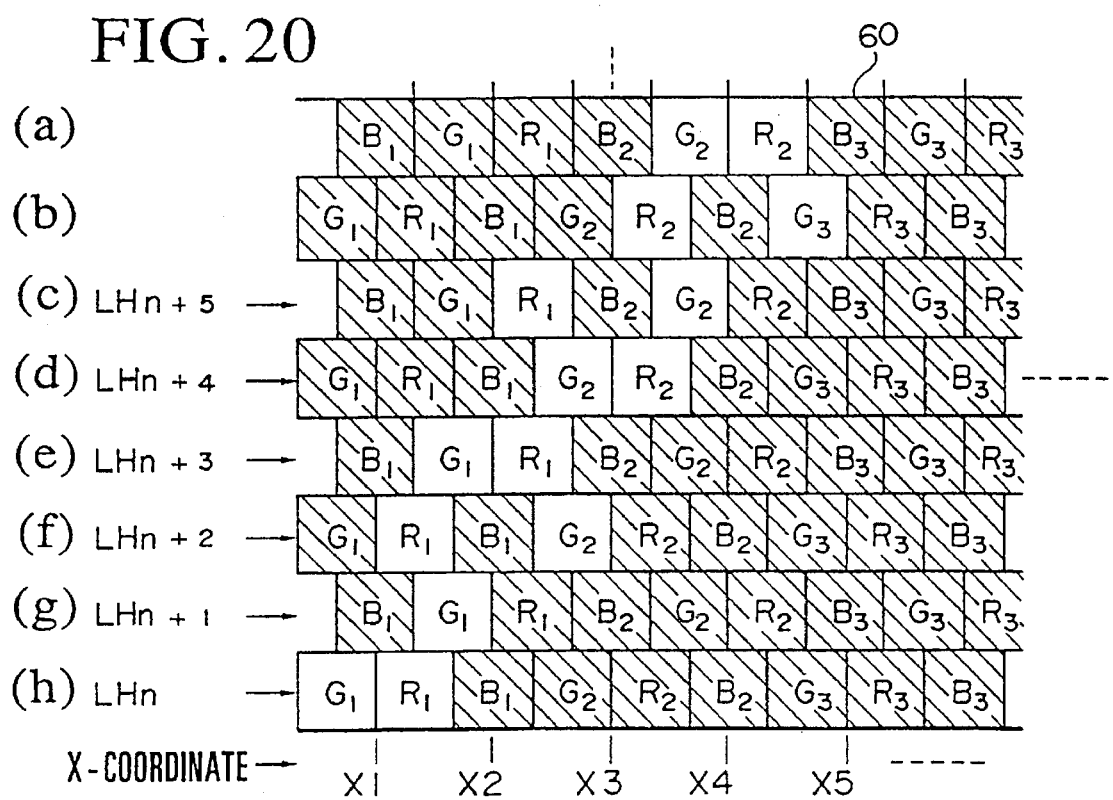
FIG. 20 schematically represents another example of the display method according to the present invention, performed on the screen of the color LCD display unit in which dots are arranged in a delta form.

Then, as illustrated in FIG. 20, a description will now be made of such a case the R, G, B dot arrangement of the color LCD display unit 60 is the delta arrangement, and the dots of G, R, B, G, R, B, ... are arranged in the line LHn and the line LH (n+even number) along the horizontal scanning direction, and also the dots of B, G, R, B, G, R, ... are arranged in the line LH (n+odd number).

As shown in FIG. 20, assuming now that first pixel groups of the line LHn and the line LH (n+even number) are $G_1$, $R_1$, $B_1$, respectively; second pixel groups thereof are $G_2$, $R_2$, $B_2$; first pixel groups in the line LH (n+odd number) are $B_1$, $G_1$, $R_1$, respectively; and second pixel groups thereof are $B_2$, $G_2$, $R_2$, when the pixels G and R are emitted (it becomes yellow light), the first pixel group of $G_1$, $R_1$ is emitted by the first applied data in the line LHn. Also, a portion of the dots $R_1$, $G_2$ of the first dot group and the second dot group in the lien $LH_{n+2}$ are emitted by the second applied data; and the second dot group of $G_2$, $R_2$ in the line $LF_{n+4}$ is emitted by the third applied data. Furthermore, the first dot group of $G_1$ (because a dot to emit R happens to disappear) is emitted by the first applied data in the line $LH_{n+1}$; the first dot group of $G_1$, $R_2$ in the line $LH_{n+3}$ is emitted by the second applied data; and a portion of dots $R_1$, $G_2$ of the first dot group and the second dot group in the line $LH_{n+5}$ is emitted by third applied data.

Figure 23:
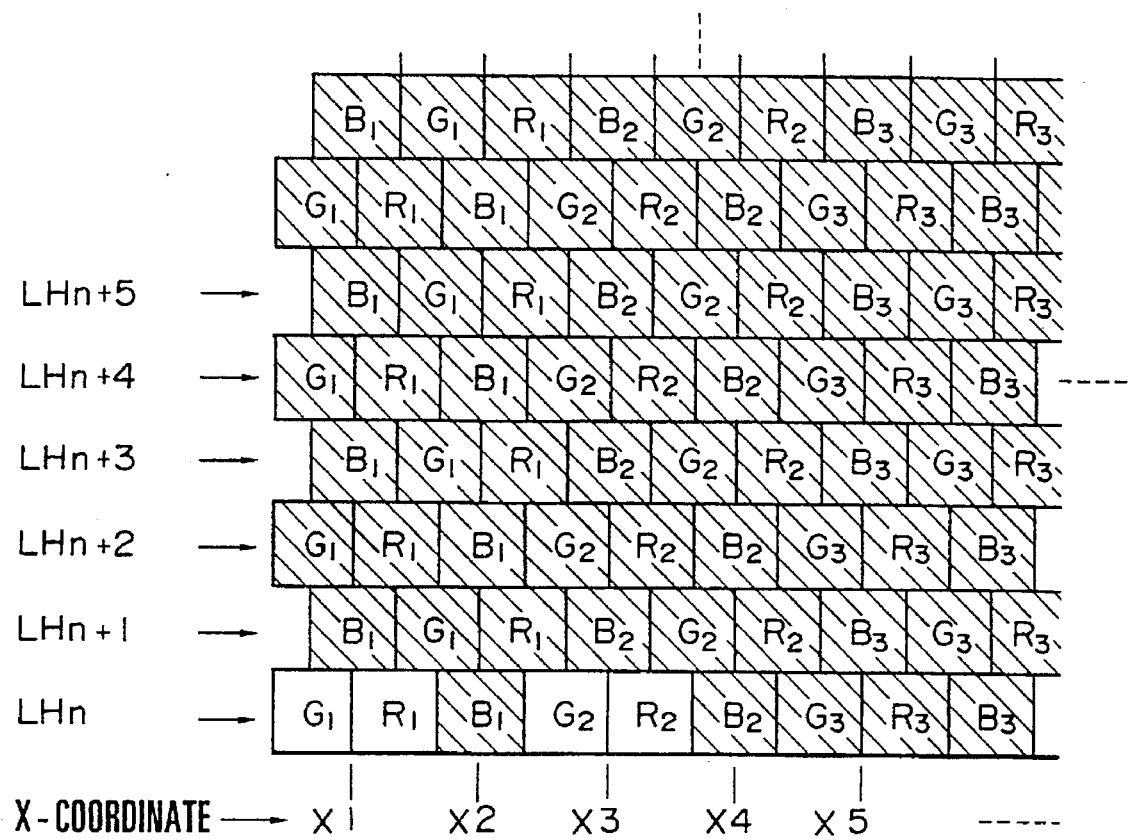
FIG. 23 is an explanatory diagram for explaining one example of the conventional data display method performed on the screen of the color LCD display unit.

Since the horizontal display resolution is achieved by this display method such that the emission of one group of the dots G, R is carried out in unit of resolution (resolution indicated by the coordinates X1, X2, X3, X4, X5, ... shown in FIG. 20), this horizontal display resolution is increased two times greater than that achieved by the conventional display method, as previously explained in FIG. 23.

Figure 21:
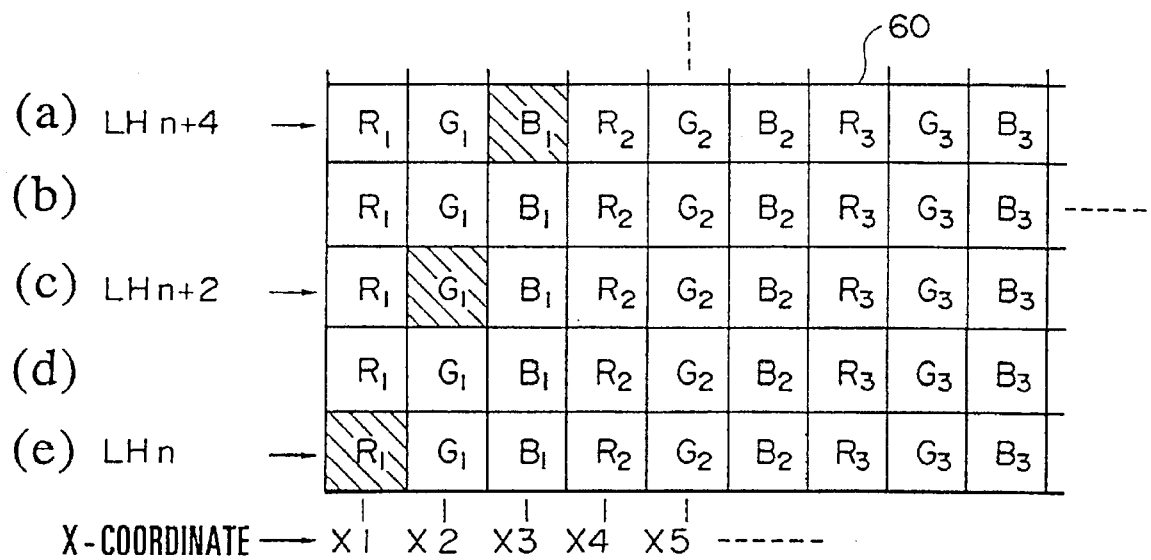
FIG. 21 schematically illustrates a further example of the data display method performed on the screen of the color LCD display unit, to which the present invention is applied.

With reference to FIG. 21, a further display example will now be explained. FIG. 21 is an enlarged view of a portion of dots in a color LCD display unit. It should be noted in FIG. 21 that display data are produced in coincident with coordinate points (X1, X2, ... ) of the X coordinate.

As shown in FIG. 21, in such an example that the R, G, B dot arrangement of the color LCD display unit is constructed by arranging a plurality of dots R, G, B, R, G, B, ... along the horizontal direction, assuming now that the first dot groups in the respective lines are $R_1$, $G_1$, $B_1$, and the second dot group is $R_2$, $G_2$, $B_2$, ... any one (e.g., $R_1$) of the dots $R_1$, $G_1$, $B_1$ for the first dot group in the line LHn, for example, $R_1$ is not emitted by the first applied data, and also any one (e.g., $G_1$) of the dots $R_1$, $G_1$, $B_1$ for the first dot group in the line $LH_{n+2}$ is not emitted by the second applied data, and any one (e.g., $B_1$) of the dots $R_1$, $G_1$, $B_1$ for the first dot group in the line $LH_{n+4}$ is not emitted by the third applied data, so that the data is displayed in the black representation (namely, reverse representation).

As the horizontal display resolution is achieved by this display method in units of one dot belonging to one group, which is not emitted, and becomes such a display unit indicated by the coordinates X1, X2, X3, X4, X5, ... of FIG. 21, this horizontal display resolution is increased three times greater than that achieved by the conventional display method, as explained with reference to FIG. 22.

In accordance with the present invention, such a compact/light weight digital oscilloscope can be provided such that the waveforms can be displayed in such a manner that color of these waveforms are separated to the respective display channels, and very easy waveform observations can be achieved.

Even when such a color dot matrix display device having a small number of dots would be employed in an oscilloscope, the respective dots are displayed by the data being produced under control of the data at the coordinate point in units of at least one dot. As a result, the horizontal display resolution of this digital oscilloscope can be improved, and therefore the waveform display quality of this oscilloscope can also be improved.

As a result, although the color TV dot matrix display device with a relatively cheap price is utilized, there are many advantages that high resolution waveform displays can be achieved.

It should be noted that in each of the above-explained embodiments, the line memory is employed as the display memory 4. Consequently, the line address generating circuit 52 and the comparator 27 are shown as the form of hardware. If a bit map memory (namely, video RAM) 76 would be utilized as this display memory to read the waveform data, since the display data are no longer required to be converted into the raster scan data, it would not be required to process the display data by way of these circuits or the software. Moreover, although the color control circuit 23, the ternary counter, and the frequency divider 17 and the like are constructed by the hardware, these operations may be realized byway of the software of the microcomputer 8.

Figure 24:
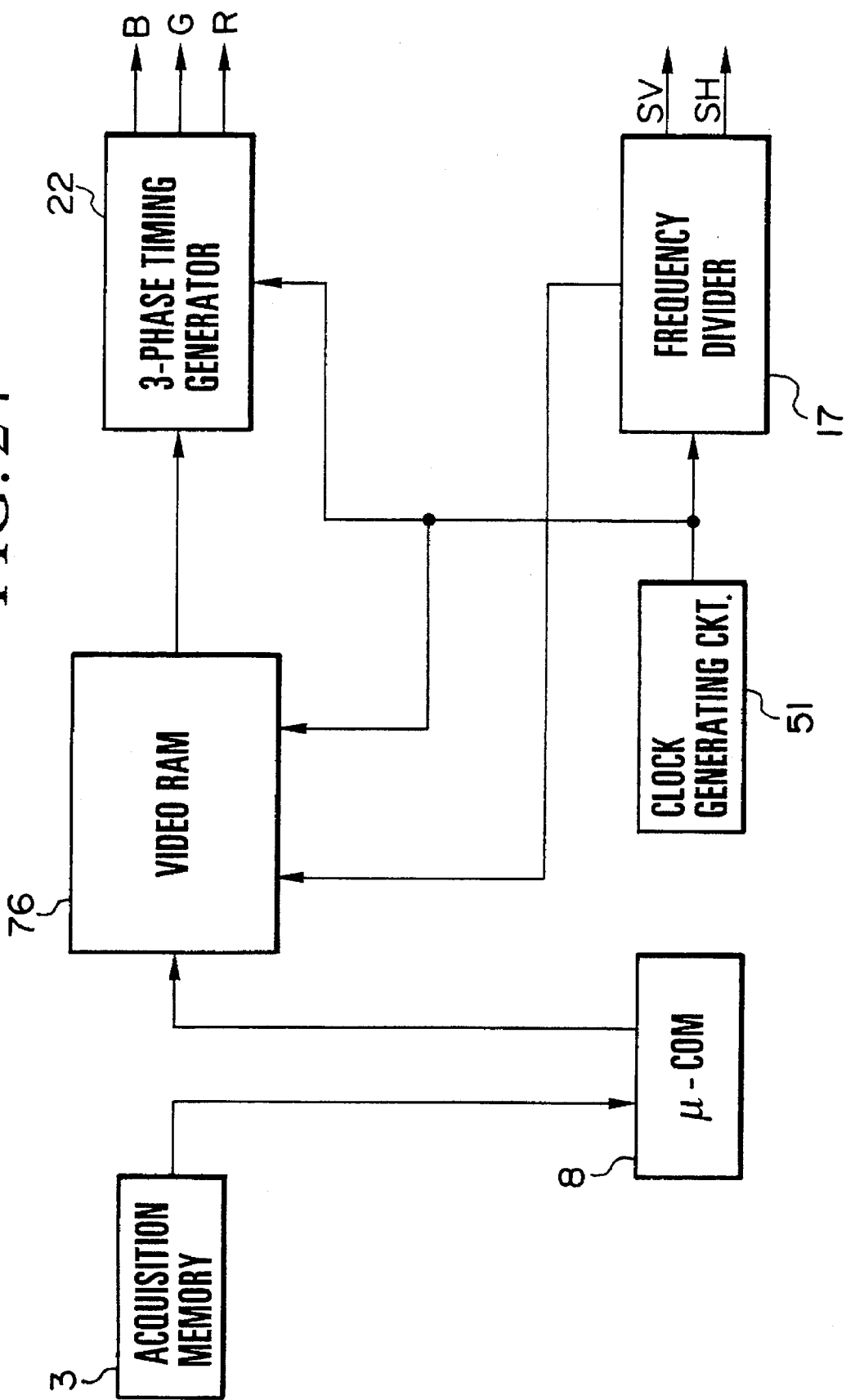
FIG. 24 is a schematic block diagram for showing an arrangement of a major portion of a digital oscilloscope according to a further embodiment of the present invention.

In addition, when the bit map memory 76 is employed as the display memory 4, the interpolation process by the interpolation circuit 28 may be realized by utilizing the software process of the microcomputer 8 as represent in FIG. 24.

Further, there have been described in the respective embodiments that the audio/video color LCD display has been employed as the color plane display device, namely the color dot matrix plane display device. The present invention is not limited thereto, but may be modified by employing the above-described office automation type color LCD display and also plasma displays, EL (electroluminescent) displays.

What is claimed is:

1. A digital oscilloscope wherein a signal to be observed is sampled to produce a sampled signal, said sampled signal is converted into a corresponding digital signal by an analog-to-digital converter, said digital signal is stored into an acquisition memory as a data signal, said data signal is read from said acquisition memory and stored into a display memory, said data signal stored into said display memory is read at a timing controlled by a display control means, said data signal read from said display memory under the control of said display control means is displayed on a display unit, said digital oscilloscope comprising:

said display control means, including:
  a color control circuit for generating red, green and blue data signals at respective display timings for red, green and blue dots in accordance with said data signal read from said display memory, and
  a sync signal generating circuit for supplying a timing signal for controlling timings for reading said data signal to said display memory, for supplying a sync signal synchronous with said timing signal to said display unit, and for supplying red, green and blue timing clock signals (RCLK, GCLK, BCLK) for generating said red, green and blue data signals for respective dots of red, green and blue to said color control circuit; and said display unit being a color dot matrix plane display device formed by a liquid crystal display, said display unit including:

a phase locked loop circuit, in accordance with said sync signal synchronous with said timing signal, for generating a scan clock signal for determining scanning timings for lighting the respective dots independently as to respective dots of said display unit,
a dot scanning circuit for generating a dot scanning signal for lighting respective dots of red, green and blue in accordance with said scan clock signal from said phase locked loop circuit and said red, green and blue data signals from said color control circuit, and
a color liquid crystal display unit for displaying said data signal read from said display memory in accordance with said dot scanning signal from said dot scanning circuit.

2. A digital oscilloscope according to claim 1, wherein sync signal generating circuit includes a clock signal generator for generating a clock signal, and a first frequency divider for frequency dividing said clock signal at a first frequency dividing ratio to output a horizontal sync signal as said sync signal, wherein said phase locked loop circuit includes:
  a voltage control circuit for generating said scanning clock signal,
  a second frequency divider for frequency dividing, and
  a phase comparator for comparing a phase of an output from said second frequency divider with a phase of said sync signal from said first frequency divider of said sync signal generating circuit of said display control unit to supply, in accordance with a result of phase comparison, a control voltage to said voltage control circuit to thereby control a frequency of said scanning clock signal from said voltage control circuit such that a phase of said output from said second frequency divider is coincident with a phase of color dot matrix plane display device of said sync signal from said first frequency divider, and wherein a ratio of said first frequency dividing ratio of said first frequency divider to said second frequency dividing ratio of said second frequency divider is substantially equal to an integer.

3. A digital oscilloscope according to claim 2, wherein said sync signal generating circuit of said display control circuit generates said red, green and blue timing clock signals (RCLK, GCLK, BCLK) having different phases for respective red, green and blue dots of said color dot matrix plane display device, and said color control circuit of said display control circuit generates said red, green and blue data signals in accordance with waveform data serving as said data signal from said display memory in synchronism with said red, green and blue timing signals to sequentially supply said red, green and blue data signals to said red, green and blue dots of said color dot matrix plane display device.

4. A digital oscilloscope according to claim 2, wherein said sync. signal generating circuit of said display control circuit further includes a three-phase timing generator circuit for generating said red, green and blue timing clock signals (RCLK, GCLK, BCLK) in accordance with said clock signal from said clock signal generator, and wherein said clock signal from said clock signal generator is supplied to said display memory as said timing signal.

5. A digital oscilloscope according to claim 2, wherein said color control circuit of said display control circuit generates said red, green and blue data signals at such timings that a display coordinate point of the waveform data on said color dot matrix plane display device is formed by a combination of different color dots adjacent to each other in coordinates and that at least one of the dots for constituting display coordinate points located adjacent to said respective display coordinate points is displayed by way of at least one of said dots of said respective display coordinate points.

6. A digital oscilloscope according to claim 2, wherein said color control circuit of said display control circuit generates said red, green and blue data signals at such timings that a display coordinate point of the waveform data on said is formed by a combination of different color dots adjacent to each other in coordinates and that at least one of the dots for constituting display coordinate points located adjacent to said respective display coordinate points is displayed by way of at least one of said dots of said respective display coordinate points.

7. A digital oscilloscope according to claim 2, wherein said color control circuit of said display control circuit generates said red, green and blue data signals at such timings that a pitch of the display coordinate points of the waveform data on said color dot matrix plane display device is made coincident with a pitch of the dots of said color dot matrix plane display device.

8. A digital oscilloscope according to claim 2, wherein said color control circuit of said display control circuit generates said red, green and blue data signals at such timings that the display coordinate points of the waveform data on said color dot matrix plane display device are one-to-one correspondence with the dots of said color dot matrix plane display device.

9. A digital oscilloscope according to claim 2, wherein said color control circuit of said display control circuit generates said red, green and blue data signals at such timings that a display dot for interpolation waveform data for connecting two dots of real waveform data to be displayed on said color dot matrix plane display device is formed by only one dot of respective rows of dots along a horizontal scanning direction.

* * * * *